US012803393B2

(12) United States Patent
Wang et al.

(10) Patent No.: US 12,803,393 B2
(45) Date of Patent: Nov. 17, 2026

(54) METHOD FOR MONITORING HEALTH OF AN ELECTRIC MACHINE

(71) Applicant: GE Aviation Systems LLC, Grand Rapids, MI (US)

(72) Inventors: Guanghua Wang, Clifton Park, NY (US); Jason Randall Gulley, Liberty Township, OH (US); Lili Zhang, Mason, OH (US); James Patrick Mahle, Vandalia, OH (US); Xiaochuan Jia, Centerville, OH (US)

(73) Assignee: GE Aviation Systems LLC, Grand Rapids, MI (US)

( * ) Notice: Subject to any disclaimer, the term of this patent is extended or adjusted under 35 U.S.C. 154(b) by 126 days.

(21) Appl. No.: 18/977,357

(22) Filed: Dec. 11, 2024

(65) Prior Publication Data

US 2026/0163450 A1    Jun. 11, 2026

(51) Int. Cl.

| | |
|---|---|
| ***H02K 11/22*** | (2016.01) |
| ***G01R 31/34*** | (2020.01) |
| ***G02B 27/00*** | (2006.01) |
| ***H02K 9/08*** | (2006.01) |
| ***H02K 11/00*** | (2016.01) |

(Continued)

(52) U.S. Cl.

CPC ........... *H02K 11/22* (2016.01); *G01R 31/343* (2013.01); *G02B 27/0006* (2013.01); *H02K 9/08* (2013.01); *H02K 11/0094* (2013.01); *H02K 11/25* (2016.01); *H02K 99/10* (2016.11)

(58) Field of Classification Search

CPC . B64D 2045/0085; B64D 27/33; F01D 15/10; F01D 19/00; F01D 21/003; F01D 21/12; G01J 2005/0033; G01J 2005/0077; G01J 5/0022; G01J 5/0088; G01R 31/343; G02B 27/0006; H02K 11/0094; H02K 11/22; H02K 11/25; H02K 9/08; H02K 99/10; H02P 29/024

See application file for complete search history.

(56) References Cited

U.S. PATENT DOCUMENTS

| | | |
|---|---|---|
| 6,570,175 B2 | 5/2003 | Bales et al. |
| 7,422,365 B2 | 9/2008 | Chamberlain et al. |

(Continued)

FOREIGN PATENT DOCUMENTS

| | | |
|---|---|---|
| CN | 201903400 U * | 7/2011 |
| CN | 102624323 A | 8/2012 |

OTHER PUBLICATIONS

CN-201903400-U, all pages (Year: 2011).*

(Continued)

*Primary Examiner* — Naishadh N Desai

(74) *Attorney, Agent, or Firm* — Thomas | Horstemeyer, LLP

(57) ABSTRACT

A method for monitoring the health of an electric power train or electric machine thereof are disclosed herein. The method includes imaging a rotor at a start of a spin down process to determine a first rotor temperature, and imaging the rotor at an end of or after the spin down process to determine a second rotor temperature to determining a rotor temperature reduction. A maximum rotor temperature can be determined as a summation of the temperature after the spin down process and the rotor temperature reduction, which can be used to indicate the health of the electric power train or the electric machine.

20 Claims, 9 Drawing Sheets

(51) Int. Cl.
*H02K 11/25* (2016.01)
*H02K 99/00* (2014.01)

(56) References Cited

U.S. PATENT DOCUMENTS

| | | | | |
|---|---|---|---|---|
| 10,823,618 | B2 | 11/2020 | Wang et al. | |
| 10,845,252 | B2 | 11/2020 | Bonifas et al. | |
| 10,845,253 | B2 | 11/2020 | Wang et al. | |
| 11,193,820 | B2 | 12/2021 | Wang et al. | |
| 11,397,112 | B2 | 7/2022 | Wang et al. | |
| 2013/0088019 | A1* | 4/2013 | Huang | B60R 16/03 290/31 |
| 2021/0384853 | A1* | 12/2021 | Huang | B64D 33/00 |
| 2022/0034968 | A1 | 2/2022 | Hana et al. | |
| 2022/0271628 | A1* | 8/2022 | Miki | H02K 11/25 |

OTHER PUBLICATIONS

Dymond, James H., Raymond Ong, and Nick Stranges. "Instrumentation, testing, and analysis of electric machine rotor steady-state heating." IEEE Transactions on Industry Applications 38.6 (2002): 1661-1667.

* cited by examiner

METHOD FOR MONITORING HEALTH OF AN ELECTRIC MACHINE

TECHNICAL FIELD

The disclosure relates to a method and apparatus for monitoring the health of an electric machine.

BACKGROUND

Electric power trains such as electric machines are used in energy conversion and generation. In the aircraft industry, it is common to combine a motor mode and a generator mode in the same electric machine, where the electric machine in motor mode functions to start the engine, and, depending on the mode, also functions as a generator. As the generator, an electric machine can have a rotor driven by a source of rotation, such as a mechanical or electrical machine, which for some aircraft may be a gas turbine engine.

BRIEF DESCRIPTION OF THE DRAWINGS

A full and enabling disclosure of the present description, including the best mode thereof, directed to one of ordinary skill in the art, is set forth in the specification, which makes reference to the appended FIGS., in which.

DETAILED DESCRIPTION

Figure 1:
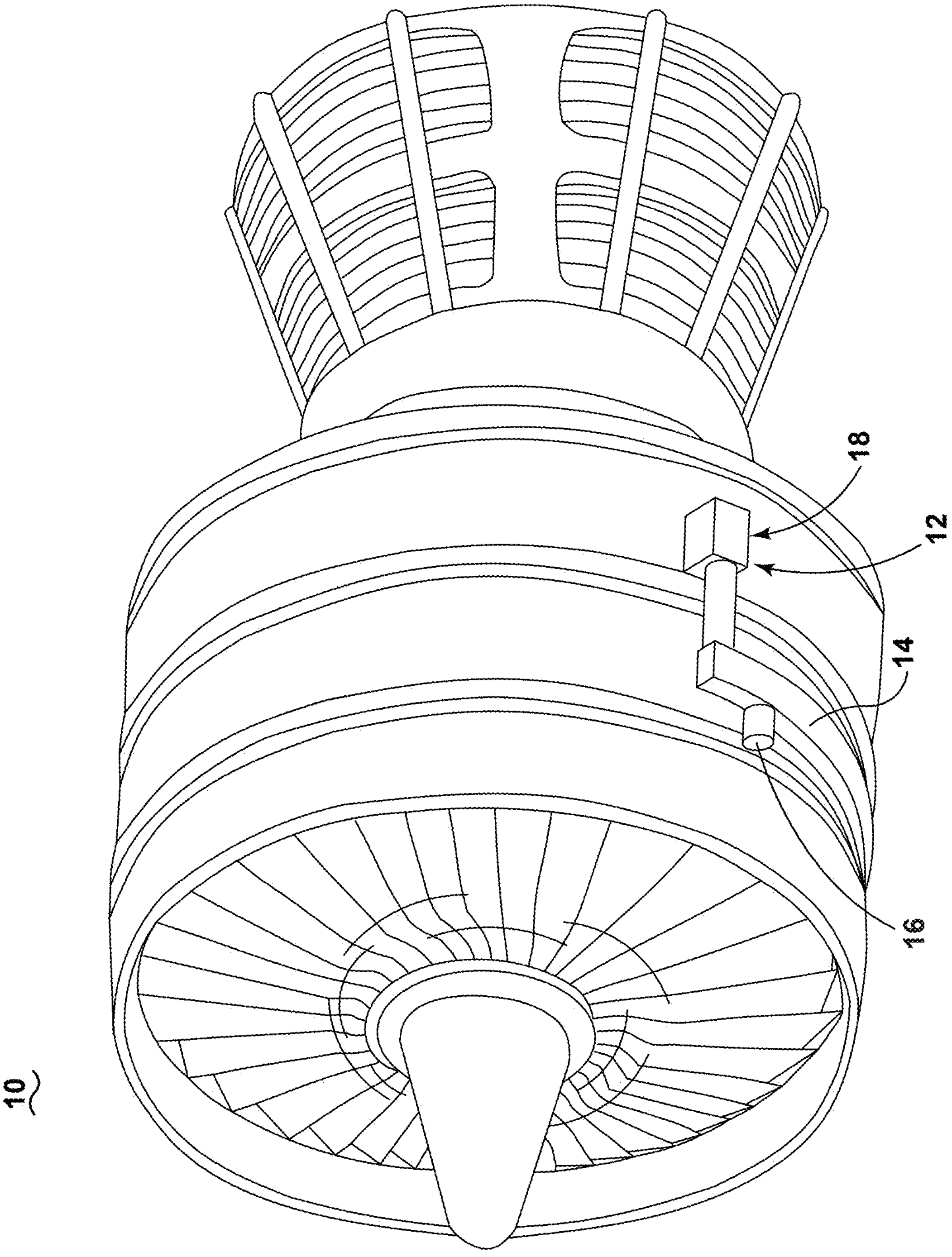
FIG. 1 is an isometric view of a turbine engine having an electric power train including a generator, in accordance with various aspects described herein.

Aspects of the present disclosure are described herein in the context of a turbine engine and a power generation source for the turbine engine or an aircraft carrying the turbine engine, including a direct current (DC) power generation source, which enables production of electrical power from an energy source such as the turbine engine, jet fuel, hydrogen, batteries, etc. However, it will be understood that the disclosure is not so limited and has general applicability to electric power trains involved in power distribution systems or power generation systems in non-aircraft applications, including other mobile applications and non-mobile industrial, commercial, and residential applications. For example, applicable mobile environments can include an aircraft, spacecraft, space-launch vehicle, satellite, locomotive, automobile, etc. Commercial environments can include manufacturing facilities or power generation and distribution facilities or infrastructure. Additionally, such electric power trains can be utilized with a turbine or need not involve a turbine.

As used herein, the term "set" or a "set" of elements can be any number of elements, including only one.

Also as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor, and the controller module or processor can perform processing on the value to determine a representative value or an electrical characteristic representative of said value.

As used herein, the term "real time" can represent that time during which the system is operating, such as during operation of an electric power train, or a component or potion thereof, such as an electric machine. Measurements made by sensors described herein, such as a camera or a partial discharge sensor, can process data to provide a signal that is virtually immediate, such as within milliseconds or faster, representing the current state of the system.

All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Non-limiting examples include power distribution bus connections or disconnections can be enabled or operated by way of switching, bus tie logic, or any other connectors configured to enable or disable the energizing of electrical loads downstream of the bus. Additionally, as used herein, "electrical connection" or "electrically coupled" can include a wired or wireless connection. The exemplary drawings are for purposes of illustration only and the dimensions, positions, order and relative sizes reflected in the drawings attached hereto can vary.

As used herein, the term "electric power train" refers to electrical components or assemblies related to electric power generation or conversion of electrical energy into mechanical energy or motion. The electric power train can include a battery or other power storage, a converter, an inverter, power cables or connectors, and an electric machine, as well as components thereof.

As used herein, the term "electric machine" refers to electrical components or assemblies related to electric power generation that use electromagnetic forces to convert mechanical energy into electrical energy, or electrical energy into mechanical energy. The electric machine can include generators, starters, motors, transformers, or components thereof, including but not limited to rotors, stators, bearings, or shafts.

Additionally, as used herein, a "controller" or "controller module" can include a component configured or adapted to provide instruction, control, operation, or any form of communication for operable components to effect the operation thereof. A controller module can include any known processor, microcontroller, or logic device, including, but not limited to: field programmable gate arrays (FPGA), an application specific integrated circuit (ASIC), a full authority digital engine control (FADEC), a proportional controller (P), a proportional integral controller (PI), a proportional derivative controller, a proportional integral derivative controller (PID controller), a hardware-accelerated logic controller (e.g. for encoding, decoding, transcoding, etc.), the like, or a combination thereof. Non-limiting examples of a controller module can be configured or adapted to run, operate, or otherwise execute program code to effect operational or functional outcomes, including carrying out various methods, functionality, processing tasks, calculations, comparisons, sensing or measuring of values, or the like, to enable or achieve the technical operations or operations described herein. The operation or functional outcomes can be based on one or more inputs, stored data values, sensed or measured values, true or false indications, or the like. While "program code" is described, non-limiting examples of operable or executable instruction sets can include routines, programs, objects, components, data structures, algorithms, etc., that have the technical effect of performing particular tasks or implement particular abstract data types. In another non-limiting example, a controller module can also include a data storage component accessible by the processor, including memory, whether transient, volatile or non-transient, or non-volatile memory.

Additional non-limiting examples of the memory can include Random Access Memory (RAM), Read-Only Memory (ROM), flash memory, or one or more different types of portable electronic memory, such as discs, DVDs, CD-ROMs, flash drives, universal serial bus (USB) drives, the like, or any suitable combination of these types of memory. In one example, the program code can be stored within the memory in a machine-readable format accessible by the processor. Additionally, the memory can store various data, data types, sensed or measured data values, inputs, generated or processed data, or the like, accessible by the processor in providing instruction, control, or operation to effect a functional or operable outcome, as described herein. In another non-limiting example, a control module can include comparing a first value with a second value, and operating or controlling operations of additional components based on the satisfying of that comparison. For example, when a sensed, measured, or provided value is compared with another value, including a stored or predetermined value like a threshold value, the satisfaction of that comparison, such as meeting or exceeding such a threshold value, can result in actions, functions, or operations controllable by the controller module. It will be understood that such a determination may easily be altered to be satisfied by a positive/negative comparison or a true/false comparison. Example comparisons can include comparing a sensed or measured value to a threshold value or threshold value range.

Aspects of the disclosure can be implemented in any environment using an electric power train. For purposes of this description, such an electric power train will be generally referred to as one or more electrical components, such as those components utilized in generating power for a turbine engine, including but not limited to, a battery, a converter, an inverter, a generator, a motor, a starter, an electric machine assembly, transformer, or similar language, as well as components thereof, such as one or more stator/rotor combinations for a generator. It should be appreciated that while this description is related to an electric power train for a turbine engine, the electric power train need not be specific to or related to a turbine or turbine engine. While this description is primarily directed toward an electric power train providing power generation, it is also applicable to an electric power train providing both a driving force and power generation. Additionally, it is applicable to a motor, like that providing a driving force to propellers in electrified aircraft propulsion (EAP). For example, a generator can include a starter/generator, multi-winding or output generators, or the like. Further, while this description is primarily directed toward an aircraft environment, aspects of the disclosure are applicable in any environment using an electric power train.

The exemplary drawings are for purposes of illustration only and the dimensions, positions, order and relative sizes reflected in the drawings attached hereto can vary.

FIG. 1 illustrates a turbine engine 10 having an electric power train 12 including an accessory gearbox (AGB) 14 and a generator 16 according to an aspect of the disclosure. The turbine engine 10 can be a turbofan engine, in a non-limiting example, while any turbine engine or turbomachine is contemplated. The AGB 14 can be coupled to a turbine shaft of spool of the turbine engine 10 by way of a power converter 18, like a mechanical power converter. While a generator 16, such as an AC generator, is shown and described, aspects of the disclosure can include any electrical machine, including but not limited to an electric component, a generator, a starter, a motor, transformer or components thereof. Non-limiting examples of electric power train components can include batteries, fuel cells, converters, inverters, an electric machine, or the like.

Figure 2:
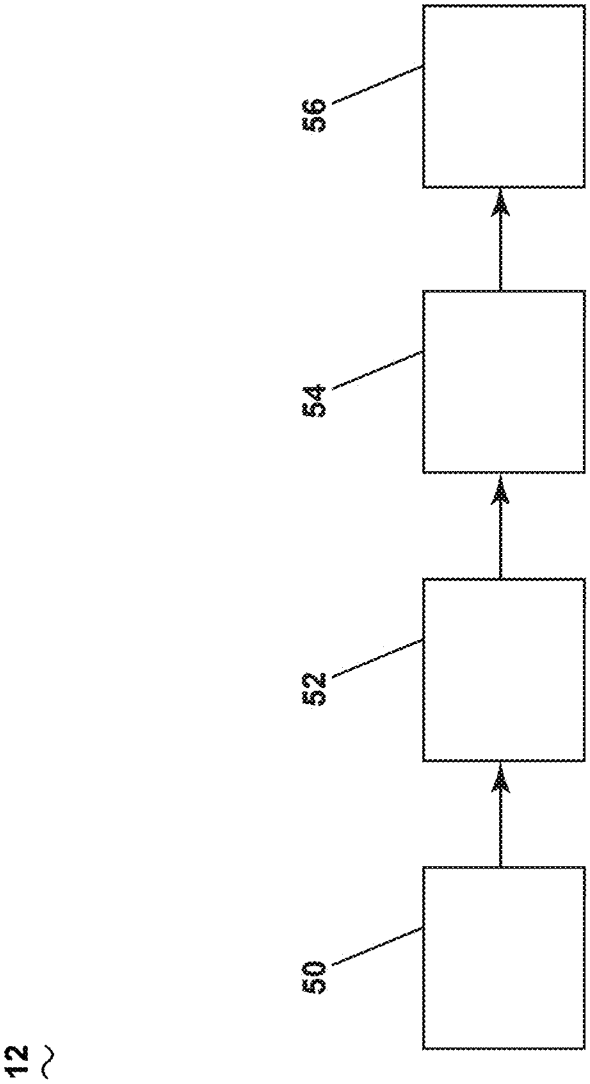
FIG. 2 is a schematic view of the electric power train of FIG. 1, in accordance with various aspects described herein.

FIG. 2 illustrates a schematic view of the electric power train 12 of FIG. 1 including a battery 50, a converter 52, an inverter 54, and an electric machine 56. The battery 50 can be any energy storage unit or system, such as one that stores electrical or chemical energy, like fuel cells in a non-limiting example. The converter 52 provides for converting the energy from the battery 50 into a usable form, like a DC-DC converter in a non-limiting example. The inverter 54 can convert the DC from the converter 52 to AC, and can be any component providing converting electric power between AC and DC. The electric machine 56 can be the generator 16 of FIG. 1, for example, and can provide for converting the AC electrical energy provided from the inverter 54 to mechanical energy. For example, the electric machine 56 can be a generator, a motor, or any other system for reduction to mechanical energy from the energy provided from the battery 50. In an additional non-limiting example, the electric power train 12 can provide for converting mechanical energy driving the electric machine 56 into electrical energy, which can be converted by the inverter 54 and the converter 52 into a form that can be stored in the battery 50. Furthermore, the electric power train 12 can include cables or connectors connecting one or more of the battery 50, the converter 52, the inverter 54, or the electric machine 56, as well as the elements or components of the battery 50, the converter 52, the inverter 54, or the electric machine 56.

Figure 3:
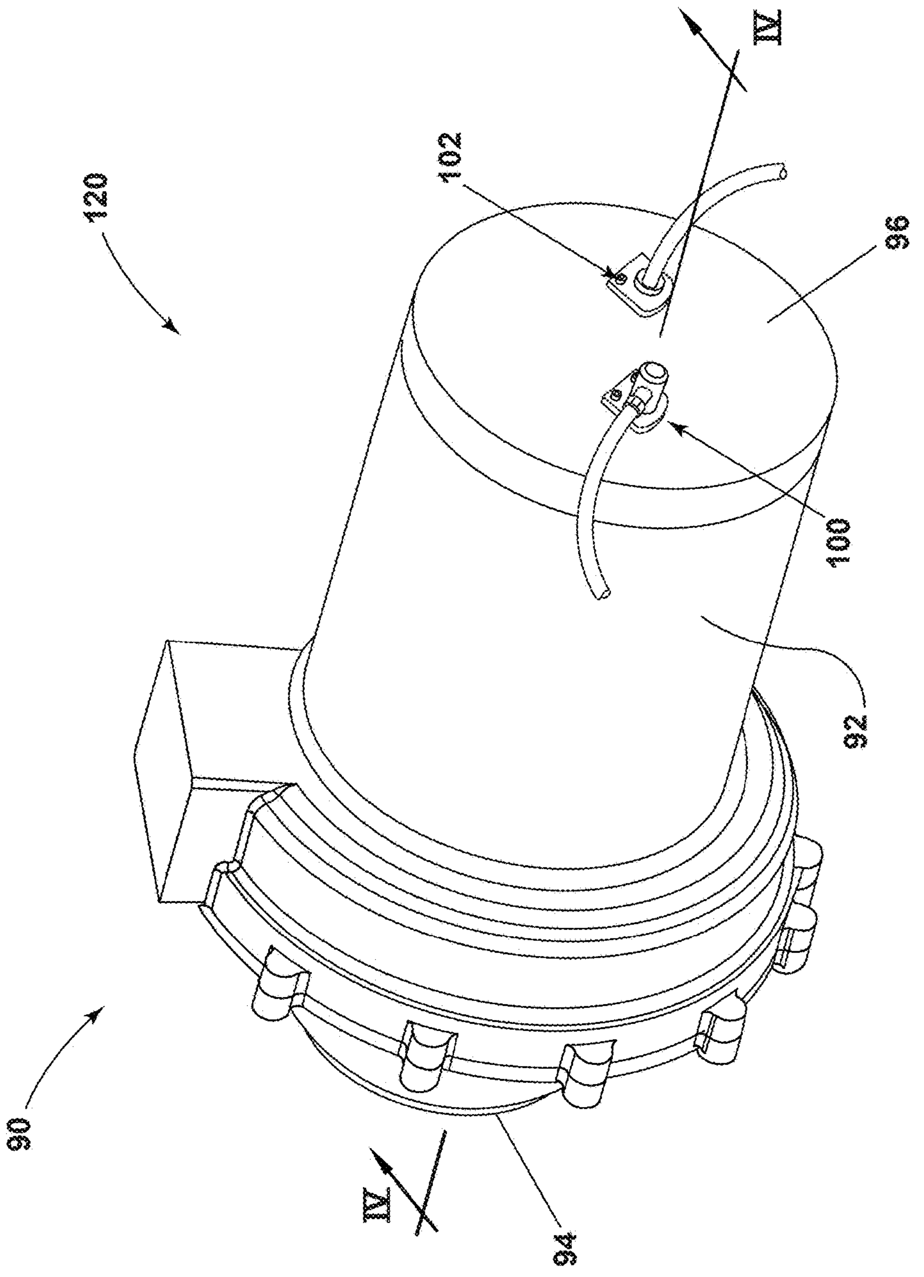
FIG. 3 is an isometric view of the generator of FIG. 1, in accordance with various aspects described herein.

FIG. 3 illustrates an electric machine 120 as a generator 90, that can be the generator 16 of FIG. 1 of the electric machine 56 of FIG. 2, for example. In a non-limiting example, the generator 90 can be a rotating machine, including a rotor and stator assembly to generate a supply of electric current. The generator 90 includes a housing 92 in accordance with aspects of the disclosure. The housing 92 can include a first end 94 and an opposing second end 96. Electrical connections (not shown) can be coupled to the generator 90 to provide for the transfer of electrical power to and from the generator 90. Such electrical connections can be further connected by cables to a rectifier, a converter, and then to an electrical power distribution node of an aircraft having the turbine engine 10 (FIG. 1) to power various items on the aircraft, such as an energizing electrical environmental control system, highly transient electrical loads, electrical deicing loads, lights, and seat-back monitors. In one non-limiting example, further components (e.g., the rectifier, the converter, or the like), can be integral with the generator 90, or can be located remotely, apart from, or separate from the generator 90.

The generator 90, in non-limiting examples, can be either a synchronous or an asynchronous generator. In addition, other components that may need to be included or connected to the generator 90 for particular applications. For example, there can be other accessories driven from the same rotatable shaft as the HP and LP spools of the turbine engine 10 (FIG. 1), such as the liquid coolant pump, a fluid compressor, or a hydraulic pump, and operably or otherwise connected with the generator 90.

During power-generating operations, the rotation transferred to the generator 90 ultimately induces or generates current in stator windings contained within the generator 90. The generator 90 supplies the generated current to power or energize a set of electrical loads. Specifically, the rotation of a set of permanent magnets coupled to a rotor relative to the stator windings generates current in the stator windings that is ultimately provided to a set of electrical loads or an electrical bus.

A health monitoring system 88 can include a first sensor that can be an infrared sensor or a camera 100 that can couple or affix to the housing 92 at the second end 96, such that the camera 100 can image the interior of the generator 90. In non-limiting examples, the camera 100 can be an infrared sensor or an ultraviolet sensor. The camera 100 can generate a signal representative of a temperature of the electric machine 120. The camera 100 can be advantageous over thermocouples or RTD sensors as the camera 100 can provide a temperature distribution over an area or region of the electric machine 120, while thermocouples and RTD sensors measure a single location. In a non-limiting example, the camera 100 can be small, such as about an inch in size, or being 1.5 inches or smaller, or being 1 inch or smaller in non-limiting examples. Such a small size for the camera 100 permit in situ incorporation within the generator 90, or the housing thereof 92, which provides a negligible increase in size or weight of the generator 90, such as less than a 1% increase individually or collectively, relative to a similar generator without the camera 100, or even having a lesser weight including the camera 100 as compared to a generator without the camera 100, or among a set of multiple cameras 100. For example, where the generator 90 is about 50 kilograms (kg) and the camera 100 can be about 100 grams (g), a change in power density would be about 0.2%. The small size permits the in situ incorporate into the generator 90 without significant impact to size or weight, which are at a premium in power train environments, like that of the turbine engine 10 (FIG. 1). Furthermore, the small size for the camera 100 can be incorporated into the generator without changing or impacting the component's power density. Thus, such a small camera 100 permits real time, in situ health monitoring for the generator 90, with negligible impact to size and weight of the generator 90, as well as negligible impact to power density.

A second sensor is provided as a partial discharge (PD) sensor 102 affixed to the housing 92 at the second end 96 and positioned to image the interior of the generator 90. In non-limiting examples, the PD sensor 102 can be a PCB antenna, a capacitive sensor, a RTD, a thermocouple, or an inductive sensor. In a non-limiting example, the PD sensor 102 can be positioned within a shielding structure, such as the housing of the electric machine 120, like the housing 92 of the generator. In a non-limiting example, the PD sensor 102 can be positioned or located within the electric machine 120, or a housing thereof, or can be an embedded antenna. In a further non-limiting example, the PD sensor 102 can be positioned exterior of the electric machine 120, or its housing, such as where the PD sensor 102 is a radio frequency current transformer (RFCT) positioned across the leads connecting to the machine windings within the generator 90. In another non-limiting example, the PD sensor 102 can be positioned anywhere in or along an electric power train, or positioned on, at, near, or adjacent to components of the electric power train. In an example where there is continuous electromagnetic interference shielding, the PD sensor 102 should be positioned interior of such shielding to permit measurement of the electric machine 120. The PD sensor 102 can generate a signal representative of the occurrence of partial discharge within the electric machine 120.

Additionally, while only first and second sensors are illustrated, any number of cameras is contemplated. Furthermore, while each of the camera 100 and the PD sensor 102 are positioned on the housing 92 at the second end 96, it should be appreciated that any positioning on, around, in, or at the electric machine 120 is contemplated. For example, the PD sensor 102 can be tied to or located at a local electric circuit, such as through inductive or capacitive coupling, while the camera 100 is located on the second end 96 of the housing 92. It should be understood that the particular positioning and arrangement of the camera 100 and PD sensor 102 can differ based upon the particular electric machine 120 or electric power train 12 (FIG. 2). An infrared sensor for the camera 100 can be advantageous over other sensors for a generator environment. For example, an infrared sensor will have a faster system response than a thermocouple, and is better suited for the harsh environment of the generator 90 since it can be protected or isolated from the environment it is measuring. An ultraviolet sensor can be utilized to detect corona or other partial discharge. The PD sensor 102 is better suited to determine health of electric components of an electric power train or an electric machine, such as rotor and stator windings, semiconductors, capacitors, or other electric or electronic components by determining the existence of partial electrical discharge emitted by such components. Additional alternate sensors are typically larger or heavier, and are not suited for the electric machine environment within the turbine engine, or are less reliable or less accurate. In a non-limiting example, only the first sensor as the camera 100 can be utilized, and need not include the second sensor or the PD sensor 102, or vice versa.

Electric and hybrid electric aircraft and vehicles are increasingly subject to greater electric power system criticality, reliability, and asset value. Therefore, monitoring of the health condition of electric power trains or the electric machines becomes increasingly important, as well as ensuring accurate measurement to permit accurate monitoring. The disclosure herein provides a method and apparatus for monitoring electric machines or the electric power trains for a turbine engine, like the turbine engine 10 of FIG. 1, the electric power train 12 of FIG. 2, or the generator 90 of FIG. 3.

Figure 4:
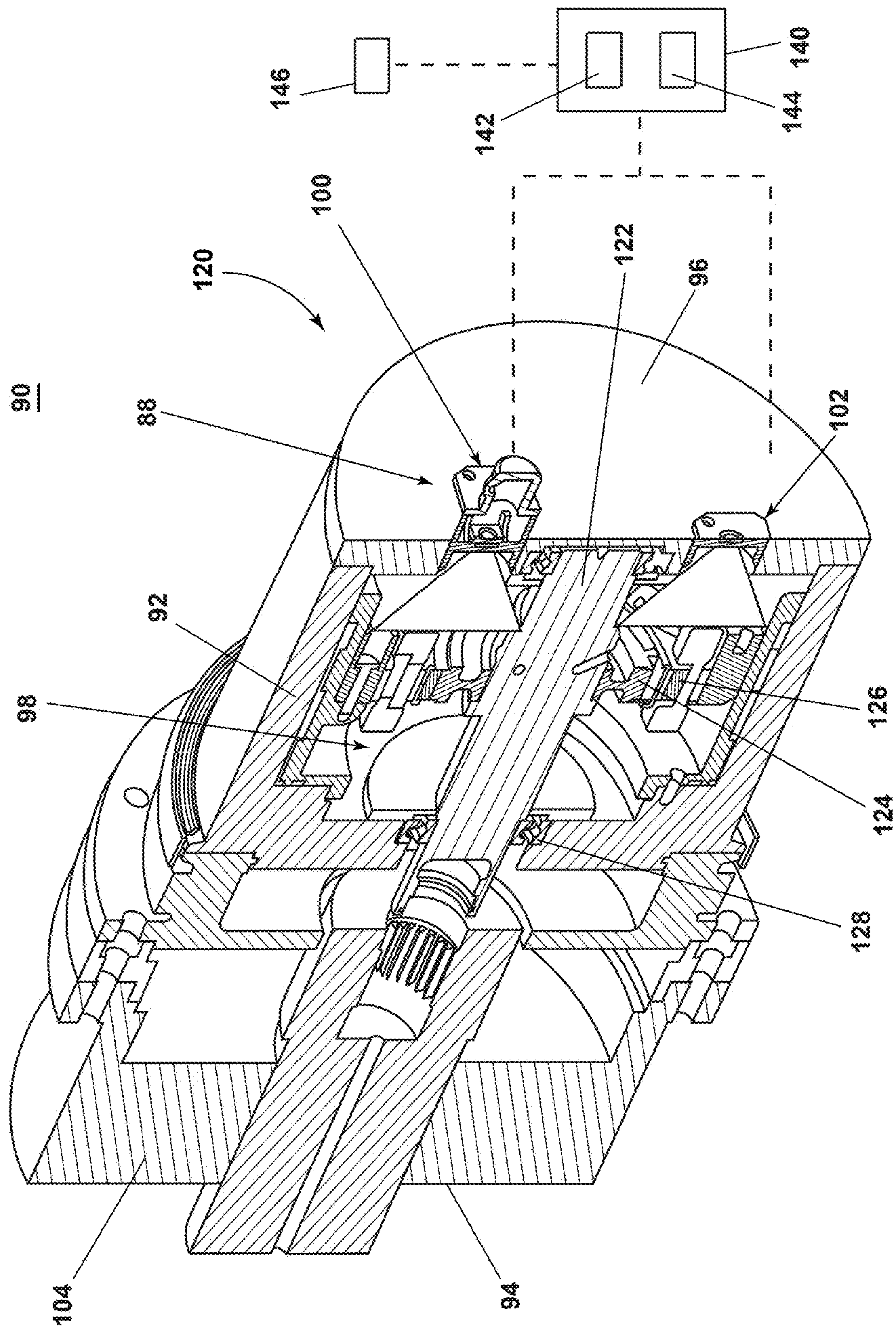
FIG. 4 is a schematic, sectional view of the generator of FIG. 3 taken along line IV-IV, in accordance with various aspects described herein.

FIG. 4 shows a sectional view of the generator 90 of FIG. 3 taken along line IV-IV, showing the housing 92 surrounding a generator interior 98. An accessory gearbox 104 couples to the generator 90 at the first end 94, which can be the AGB 14 of FIG. 1, for example.

The generator 90 includes a rotatable shaft 122 coupled to a generator rotor 124. A generator stator 126 is spaced from the generator rotor 124. The generator stator 126 can have a set of windings to generate an electric current when the generator rotor 124 is rotated within the generator stator 126. A set of bearings 128 are positioned between the rotatable shaft 122 and the housing 92 to permit rotation of the rotatable shaft 122 within the housing 92. The generator 90 generates AC electrical power when the rotatable shaft 122 rotates, driven by the accessory gearbox 104. It should be appreciated that the electric machine 120 need not be a generator, and can be any electric power train component or electric machine, including but not limited to generators, motors, starters, or components thereof or other electric components. The electric machine 120, while represented as a generator for a turbine environment, need not be specific to a turbine-related electric machine, in an additional non-limiting example.

The camera 100 and the PD sensor 102 mount to the generator 90 at the second end 96, permitting the camera 100 to view the generator interior 98, as well as the generator rotor 124 and the generator stator 126. The PD sensor 102, as electrical and electromagnetic sensors, should be positioned to detect partial discharge, permitting the PD sensor 102 to output a signal corresponding to the occurrence of partial discharge within the generator 90. PD sensors 102 as a corona scope type sensor or ultraviolet sensor can be positioned to image or view the generator 90. While only a single camera 100 and a single PD sensor 102 are shown, it should be appreciated that multiple sensors can be utilized, such as multiple cameras 100, multiple PD sensors 102, or arrays thereof. In a non-limiting example, an array of multiple sensors can be provided in annular arrangement at the second end 96. Multiple sensors permit measurement of the entirety of the generator 90, which is useful in determining the health of the entire electric machine 120, or preparing maps, like heat maps, of the entire electric machine 120. Oil or lubricants are supplied to the generator interior 98 to minimize friction generated within the generator 90 during operation, and may provide cooling to dissipate heat generated by the generator 90. During imaging of the generator 90 by the camera 100, oil or other contaminants can obscure the view of the generator interior 98.

Use of the generator 90 within a turbine engine environment includes high system performance with high power density in order to operate consistently within the hot and harsh turbine engine environment. The camera 100 provides consistent measurement of the generator 90 despite such an environment. The camera 100 and the PD sensor 102 can be operably and communicatively coupled to a controller 140 having a processor 142 and a memory 144. The controller 140 can receive a signal from the camera 100 indicative of measurement of the generator 90 and can interpret such a signal. More specifically, where the camera 100 is an infrared sensor, the controller 140 can receive a signal generated by the infrared sensor providing a thermal image, heat map, or other thermal representation of the generator interior 98. In another non-limiting example, the camera 100 can be an ultraviolet sensor. The camera 100 provides non-intrusive, in-situ monitoring of the generator 90 or electric machine 120, which can be performed in real time. A display 146 can be communicatively coupled to the controller 140 to display information received or analyzed with the controller 140. In a non-limiting example, the display 146 can be a display in the cockpit of an aircraft upon which the generator 90 is provided. In another non-limiting example, the display 146 can be the display at a remote location, such as air traffic control or at remote location which monitors the health of the generator 90 or the electric machine 120.

The camera 100 and the PD sensor 102 permit imaging of the temperature of the generator interior 98, thereby permitting the controller 140 to monitor occurrence of partial discharge or change in the temperature of the generator 90 over time. More specifically, the camera 100 can monitor the temperature of the generator 90, including the generator rotor 124 and the generator stator 126, in order to determine a temperature trend across the generator rotor 124 and the generator stator 126 at different loading conditions for the generator 90, as well as determining a magnitude of the change in temperature. Similarly, the PD sensor 102 can monitor any electric discharge across different loading conditions. Loading conditions can include, but are not limited to electrical loading, engine operating conditions, flight conditions, rotational speeds, or operating environments. Engine operating conditions can include, but are not limited to, start-up, idle, taxi, takeoff, climb, cruise, descend, and land. Flight conditions can include, in non-limiting examples, flight path, altitude, geography, air temperature, air pressure, or weather. Rotational speeds can be the rotational speed of the rotating elements of the electric machine 120, such as the generator rotor 124. Operating environments can include, in non-limiting examples, geography or air quality, such as sandy or dusty environments. Such different loading conditions can result in electric discharge from the electric machine 120, while no such discharge results under alternate loading conditions. Similarly, different loading conditions can vary the temperature of the electric machine 120, or such as through greater or lesser demand for electric current, rotational speed to provide sufficient supply to meet electric demand, ambient temperature or pressure, engine condition as it relates to electric demand, or environmental conditions. It can be beneficial to consider or extrapolate measured temperatures or electrical discharges across a variety of loading conditions in order to anticipate when a threshold may be exceeded under such different operating conditions, while not exceeding similar thresholds under alternate operating conditions. In a non-limiting example, a measurement made by the camera 100 and the PD sensor 102 can be correlated with such loading conditions in order to determine or anticipate a system health for the generator 90 at different loading conditions. For example, when a measured surface temperature is determined by the controller 140 to be near a certain threshold that may be exceeded upon changing the loading condition, the controller 140 can then indicate or provide a message that such a threshold is expected to be met or exceeded, can take action to avoid such a loading condition, can schedule or indicate needed maintenance, or even update or change the loading conditions (where available) in order to decrease the measured surface temperature to be below the threshold, thereby maintaining system health of the generator 90 or electric machine 120, or until maintenance is available.

Furthermore, measurement by the camera 100 and the PD sensor 102 can identify transient events and correlate measurements with such events, like a start-up or shut-down process, which can be considered by the controller 140 to evaluate the health of the system during such transient events, or as it relates to overall health of the system. For example, local hot spots created during start-up can be identified as potential health conditions, which can be used to indicate needed inspection or maintenance.

Additionally, any such measurements made by the camera 100 and the PD sensor 102 can be recorded or saved by the controller 140, such as on the memory 144, to evaluate health of the system over time. For example, identified local hot spots may not initially have a temperature exceeding a particular threshold, but may increase in temperature over time during operational cycles of the generator 90 until such a threshold is exceeded, which can be based on such a rate of increase. Measurement of changes in temperature over time can identify when such a threshold is met or exceeded based upon the rate of increase. Furthermore, measurements over time can be utilized to predict how the temperature will change over time, further anticipating when a particular threshold will be met or exceeded. Such periodic measurement can therefore be utilized to predict system health over time, and anticipate any maintenance or potential issues prior to the occurrence thereof. In this way, the camera 100 and the PD sensor 102 can be used for prognostic health monitoring for the electric machine 120, which can be used to improve health monitoring and overall health of the system.

Furthermore, the camera 100 can provide for generating detailed temperature distribution maps, or heat maps, which can be utilized to create design validation and optimization, as well as facilitate product inspection. More specifically, such heat maps can be compared with design validation and optimization measurements to determine physical outcomes of operation of the electric machine 120. Such heat maps may be further correlated with measurements made by the PD sensor 102 in order to provide design validation and optimization as it relates to electric discharge.

In another non-limiting example, the camera 100 as the infrared sensor can determine changes in surface emissivity of the component being measured, like the generator rotor 124. Changes in surface emissivity can be correlated with and utilized to determine health of the insulation system over time. More specifically, an increase in surface emissivity can indicate degradation of the insulation system, which can be measured utilizing an infrared sensor like the camera 100. In a non-limiting example, the measured surface emissivity can be utilized to determine the health of windings or electrical insulation of the electric machine 120.

Figure 5:
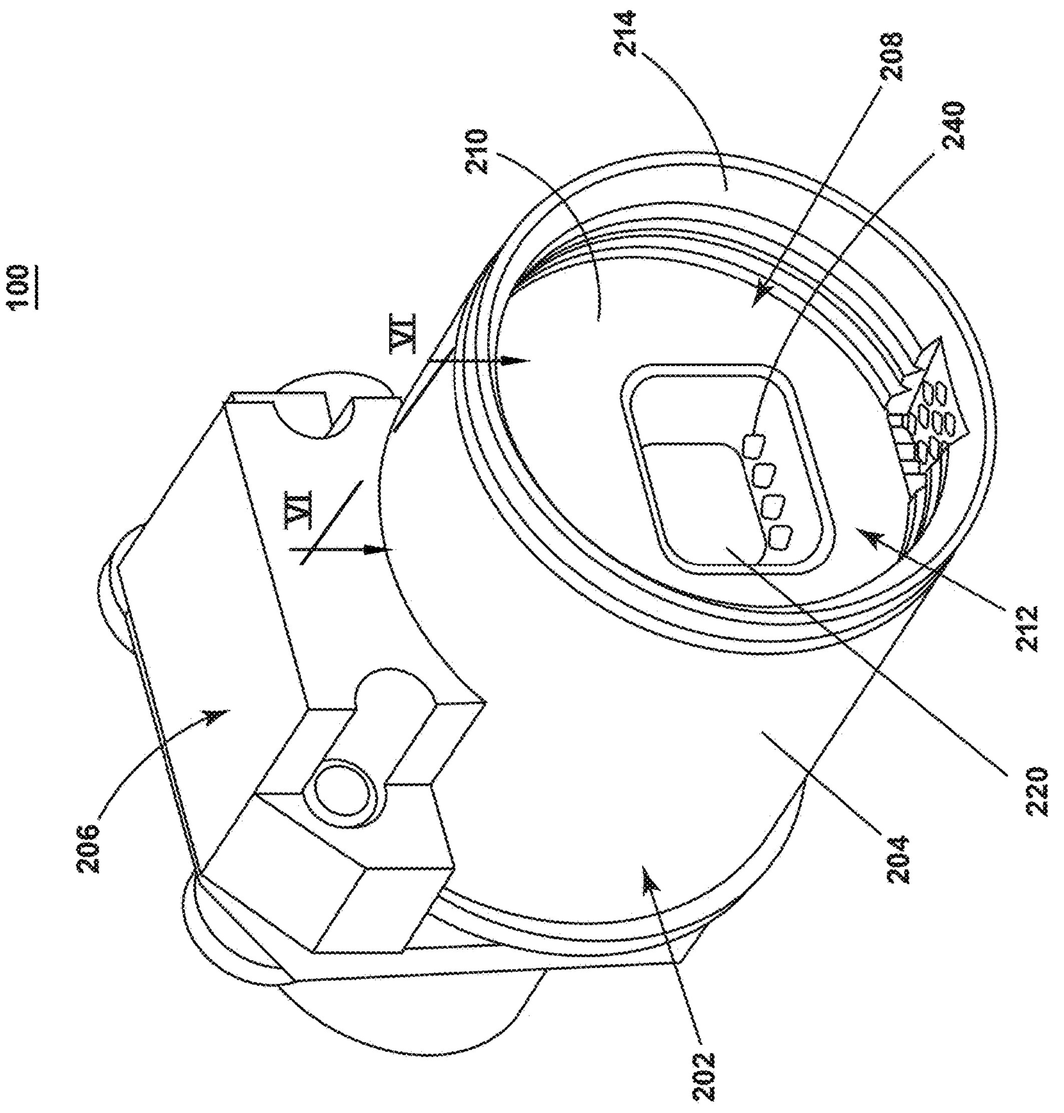
FIG. 5 is an isometric view of a camera utilized within the generator of FIG. 3, in accordance with various aspects described herein.

Referring to FIG. 5, the camera 100 includes a camera housing 202 having a body 204 with a generally cylindrical shape, and a mount 206 used to couple the camera 100 to the generator 90 (FIG. 3). While the body 204 is shown and described herein with respect to a cylindrical shape, any shape or geometry for the camera 100, the camera housing 202, and the body 204 is contemplated. The camera 100 includes an imaging end 208 having an end wall 210. The body 204 extends beyond the end wall 210 to define a cavity 212 at the imaging end 208. The cavity 212 is defined among an interior surface 214 of the body 204 and the end wall 210. A lens 220 is provided in the end wall 210 and can be used to view and image the generator 90 of FIG. 3.

Figure 6:
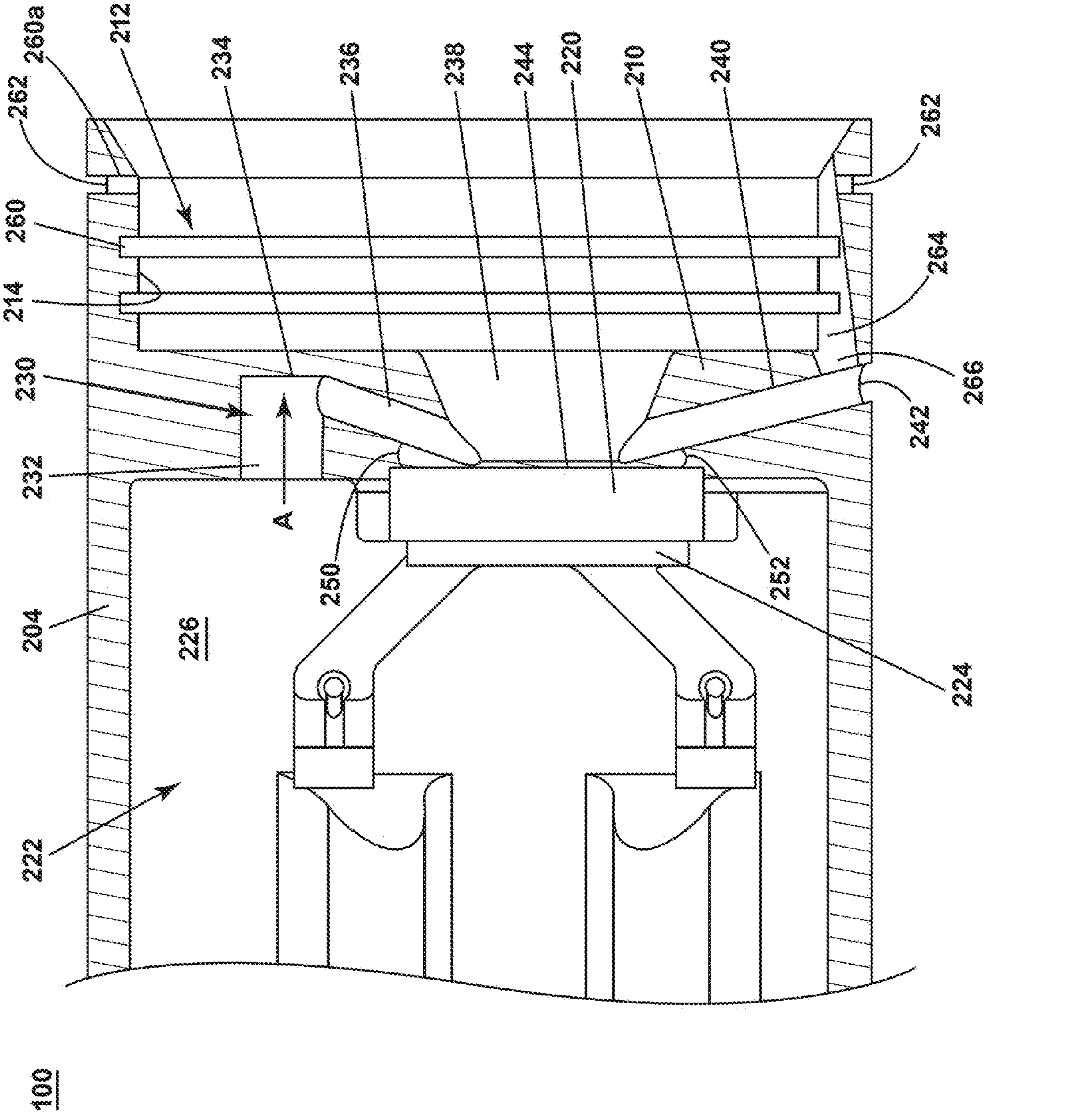
FIG. 6 is a sectional view of the camera of FIG. 5, taken along line VI-VI, in accordance with various aspects described herein.

FIG. 6 shows a sectional view of the camera 100 of FIG. 5 taken along line VI-VI. The body 204 surrounds a camera interior 222 and includes a sensor 224 capturing electromagnetic radiation focused by the lens 220, such as, for example, infrared radiation. An air passage 226 can be defined within the camera interior 222 and a supply of air (A) can be provided to the air passage 226.

An air circuit 230 can extend within the end wall 210. The air circuit 230 includes an inlet passage 232 directly adjacent to the camera interior 222 and receiving the supply of air (A). The inlet passage 232 terminates at an end surface 234. A first curtain passage 236 extends through the end wall 210 and fluidly couples the inlet passage 232 to an end wall aperture 238. The end wall aperture 238 extends through the end wall 210 providing line-of-sight access for the lens 220 to the cavity 212. A second curtain passage 240 extends through the end wall 210. The second curtain passage 240 extends between the end wall aperture 238 and an exhaust outlet 242.

The first curtain passage 236 can be arranged at a first angle 250 relative to a lens surface 244 of the lens 220. While it should be appreciated that the lens surface 244 can be curved to focus electromagnetic waves onto the sensor 224, the first angle 250 can be defined relative to a generally planar surface, such as a plane defined parallel to the end wall 210. Such a generally planar surface can be projected at the lens surface 244 for purposes of defining the first angle 250. In a non-limiting example, the first angle 250 can be greater than or equal to zero degrees (0°) and less than or equal to 45 degrees (45°). A second angle 252 can be defined for the second curtain passage 240, and can be defined similarly relative to the lens surface 244, or a projection of a plane defined parallel to the end wall 210. In non-limiting examples, the second angle 252 can be the same as the first angle 250, can be greater than or equal to zero degrees (0°) and less than or equal to 45 degrees (45°), or can be dissimilar from the first angle 250 or combinations thereof. The air circuit 230 can be defined among the inlet passage 232, the first curtain passage 236, the end wall aperture 238, and the second curtain passage 240, with the air circuit 230 exhausting at the exhaust outlet 242. The air circuit 230 provides a raking force parallel to the lens surface 244 to remove oil, oil mist, or other contaminants, as well as a perpendicular force to expel oil and other contaminants before reaching the lens 220.

A set of channels 260 are provided in the interior surface 214 and can be arranged as annular channels extending into the interior surface 214. A set of outlets 262 can extend through the body 204 from one channel **260*a* of the set of channels 260. In a non-limiting example, the set of outlets 262 can be arranged within the channel 260*a* furthest from the end wall 210. The set of outlets 262 can be arranged as two outlets provided at a top and a bottom of the body 204, where the top is defined relative to a positioning of the inlet passage 232 and the bottom is defined relative to a positioning of the exhaust outlet 242. A drainage basin 264 is formed within the interior surface 214 adjacent the second curtain passage 240. A drainage passage 266 extends through the end wall 210 to fluidly connect the drainage basin 264 to the second curtain passage 240 upstream of the exhaust outlet 242 and downstream of the end wall aperture 238, relative to a flow direction along the air circuit 230**.

Referring briefly to FIG. 5, it can be appreciated that the second curtain passage 240 can be provided as a set of multiple discrete passages, shown as four second curtain passages 240. Similarly, referring again to FIG. 6, it is contemplated that the first curtain passage 236 can be formed as a set of multiple discrete passages. In such an example, the number of multiple passages defining the first curtain passage 236 can be the same as the number of multiple passages defining the second curtain passage 240, and such passages can be aligned in a non-limiting example.

In operation, camera 100 can be utilized to image the interior of the generator 90 (FIG. 3), where the sensor 224 receives electromagnetic radiation focused through the lens 220. The interior of the generator 90 can include a volume of oil or lubricant, as well as other contaminants like salt or other debris, which can obstruct the view of the lens 220.

The air circuit 230 provides an air curtain across the lens 220 to maintain an unobstructed view for the camera 100. The supply of air (A) can be provided to the camera interior 222 as a supply of cooling air, such as bleed air from a compressor section of the turbine engine 10 (FIG. 1), or provided from within the electric machine 120, like that of a cooling fluid utilized with the generator 90 (FIG. 3). The supply of air (A) passes from the camera interior 222 to the inlet passage 232, and then passes from the inlet passage 232 to the first curtain passage 236. The supply of air (A) impinges upon the end surface 234 and can provide cooling to the end wall 210 through impingement cooling at the end surface 234. The supply of air (A) passes across the lens 220 through the end wall aperture 238. The angle of the first angle 250 orients the supply of air (A) toward the lens 220, such that the supply of air (A) partially impinges upon the lens 220 and passes along the lens 220 toward the second curtain passage 240. The supply of air (A), impinging upon and passing along the lens 220, removes oil or other contaminants through force provided by the supply of air (A), and moves such oil or other contaminants toward and into the second curtain passage 240. The oil or other contaminants are then expelled from the camera 100 through the exhaust outlet 242.

Additionally, the set of channels 260 provides for capturing at least a portion of the oil or contaminants passing toward the lens 220. The shape of the set of channels 260 provides for oil or other contaminants to move into the set of channels 260, and then pass around the annular shape of the camera housing 202 through the set of channels 260, as opposed to passing along the interior surface 214 toward the end wall 210 and ultimately toward the lens 220. The oil or contaminants pass along the set of channels 260 toward the drainage basin, where the oil or other contaminants can drain or exhaust through the drainage passage 266 to the second curtain passage 240 and exhaust through the exhaust outlet 242, or can exhaust through one or more of the set of outlets 262 within the drainage basin 264.

Therefore, the camera 100 as described herein provides for improved imaging of the electric machine 120, particularly in harsh electrical environments, like that of a generator, including oil or other contaminants. The air curtain provided along the lens 220 from the air circuit 230 provides for removing and mitigating oil or other contaminant buildup along the lens 220, which permits such improved imaging in such harsh environments.

In a non-limiting example, the camera 100 can be an infrared camera capable of monitoring temperatures of the electric power train 12 or the electric machine 120, like the generator 90 (FIG. 3). Monitoring temperatures of the electric power train 12 or the electric machine 120 permits detection of anomalies where measured temperatures are not within expected ranges or thresholds. The camera 100 permits non-intrusive, in-situ imaging of the electric power train 12 or the electric machine 120, which can provide monitoring with greater accuracy and reliability than existing systems, thereby permitting greater reliability and accuracy in detecting electrical, thermal, or mechanical failures. Furthermore, such improved monitoring can be utilized to predict or otherwise estimate when such electrical, thermal, or mechanical failures will occur, permitting preventative or remedial action prior to such a failure. In non-limiting examples, such a failure can include an open circuit, a short circuit, thermal runaway, eccentricity, or bearing failure.

Additionally, the air circuit 230 provides for cooling of the camera 100. The supply of air (A) passing through the air circuit 230 provides for heat transfer away from the camera 100, cooling the camera 100. Impingement of the supply of air (A) against the end surface 234 provides cooling to the end wall 210. In this way, the camera 100 can be well suited for hot environments, such as those within the electric power train 12 (FIG. 2), the generator 90 (FIG. 3) or turbine engine 10 (FIG. 1). Furthermore, the supply of air (A) passing within the air passage 226 impinges upon the sensor 224, cooling the sensor 224.

In an alternate, non-limiting example, it is contemplated that a mechanical feature can be utilized to clear the lens 220, such as a mechanical wiper, or other methods, including but not limited to magnetohydrodynamics.

Figure 7:
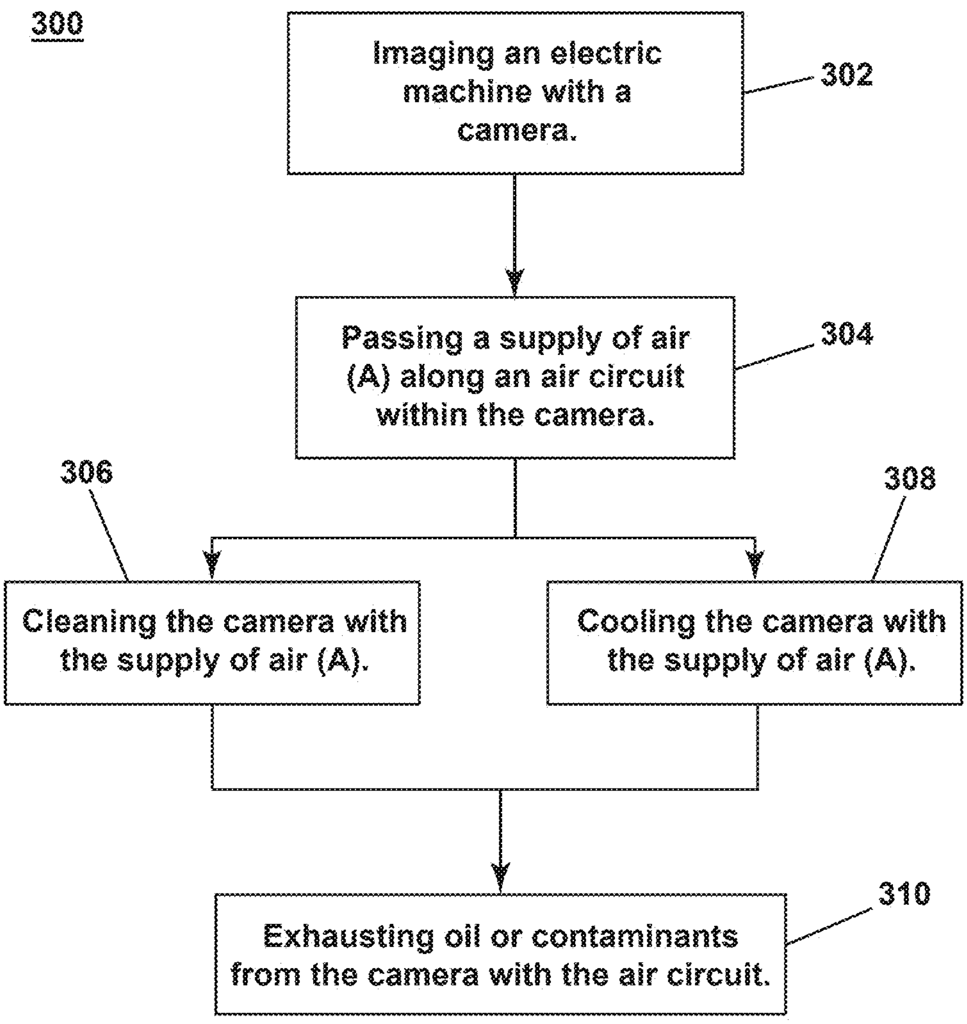
FIG. 7 is a flow chart depicting a method of imaging an electric power train, in accordance with various aspects described herein.

Referring to FIG. 7, a flow chart depicts a method 300 of imaging an electric power train, like the electric power train 12 of FIG. 2, or an electric machine, like the electric machine 120 of FIG. 3. The method 300 includes, at 302, imaging the electric power train 12 or the electric machine 120, like the turbine engine or generator, with a camera, like the camera 100 of FIGS. 5-6. In a non-limiting example, the camera 100 can be coupled to the generator 90, and can be in-situ to permit continued measurement of the electric power train 12 or the electric machine 120 by the camera 100, even during operation. Such an environment can be harsh, including oil or other contaminants which may obscure the view of the camera 100.

At 304, the method 300 can include passing a supply of air (A) along an air circuit within the camera 100, such as the air circuit 230 of FIG. 6. At 306, passing the supply of air (A) can further include cleaning the camera 100 with the supply of air (A). For example, the air circuit 230 passes the supply of air (A) along the lens 220 in order to remove oil or contaminants from the lens 220, thereby cleaning the camera 100. Passing the supply of air (A) along the camera 100 can further include impinging the supply of air (A) against the lens 220, such as at an angle of greater than or equal to zero degrees (0°) and less than or equal to 45 degrees (45°). Passing the supply of air (A) along the air circuit can further include impinging the supply of air (A) against an end surface, like the end surface 234 of FIG. 6.

At 308, passing the supply of air (A) can further include cooling the camera 100 with the supply of air (A). For example, the air circuit 230 cools the end wall 210 (FIG. 6) with the supply of air (A). Additionally, cooling the camera 100 can further include impinging the supply of air (A) on the end wall 210, such as where the supply of air (A) impinges upon the end surface 234 within the end wall 210 of FIG. 6. While the method 300 as depicted in FIG. 7 shows cleaning the camera 100 at 306 and cooling the camera 100 at 308 as alternate paths, it should be appreciated that passing the supply of air (A) along the air circuit 230, at 304, can include both cleaning the camera 100, at 306, and cooling the camera 100, at 308.

At 310, the method 300 can further include exhausting oil or contaminants from the camera 100 with the air circuit 230. For example, the oil or contaminants can be exhausted from the lens 220 to the second curtain passage 240, and can be exhausted from the air circuit 230 through the exhaust outlet 242. Additionally, or alternatively, oil or contaminants within the cavity 212 can be exhausted. For example, a portion of the oil or contaminants can be trapped in the set of channels 260 and may be exhausted from the cavity 212 through the set of outlets 262, the drainage basin 264, or both.

Benefits for the camera 100 and method 300 as described herein provide for in-situ monitoring of the electric power train 12 or the electric machine 120. Such in-situ monitoring is non-intrusive. The camera 100 is permitted to measure the electric power train 12 or the electric machine 120, as well as prevent, mitigate, or identify other electric issues, like electrical, thermal, or mechanical failures. More specifically, the air circuit 230 can provide for cooling the camera 100 to permit use within the hot environment of the turbine engine 10, the electric power train 12, or the electric machine 120. Additionally, the air circuit 230 provides an air curtain across the lens 220 to clean and clear the lens 220 of oil or other contaminants or debris, permitting the in-situ imaging within the hot and dirty environment. Further still, passive features, like the set of channels 260, the set of outlets 262, the drainage basin 264, and the drainage passage 266, provide for mitigating or preventing oil or other contaminants from passing to the lens 220, as well as draining such oil or contaminants away from the camera 100. These features make the camera 100 well suited for use in the harsh and oily environments of the generator 90 or other electric power trains 12 or electric machines 120.

Figure 8:
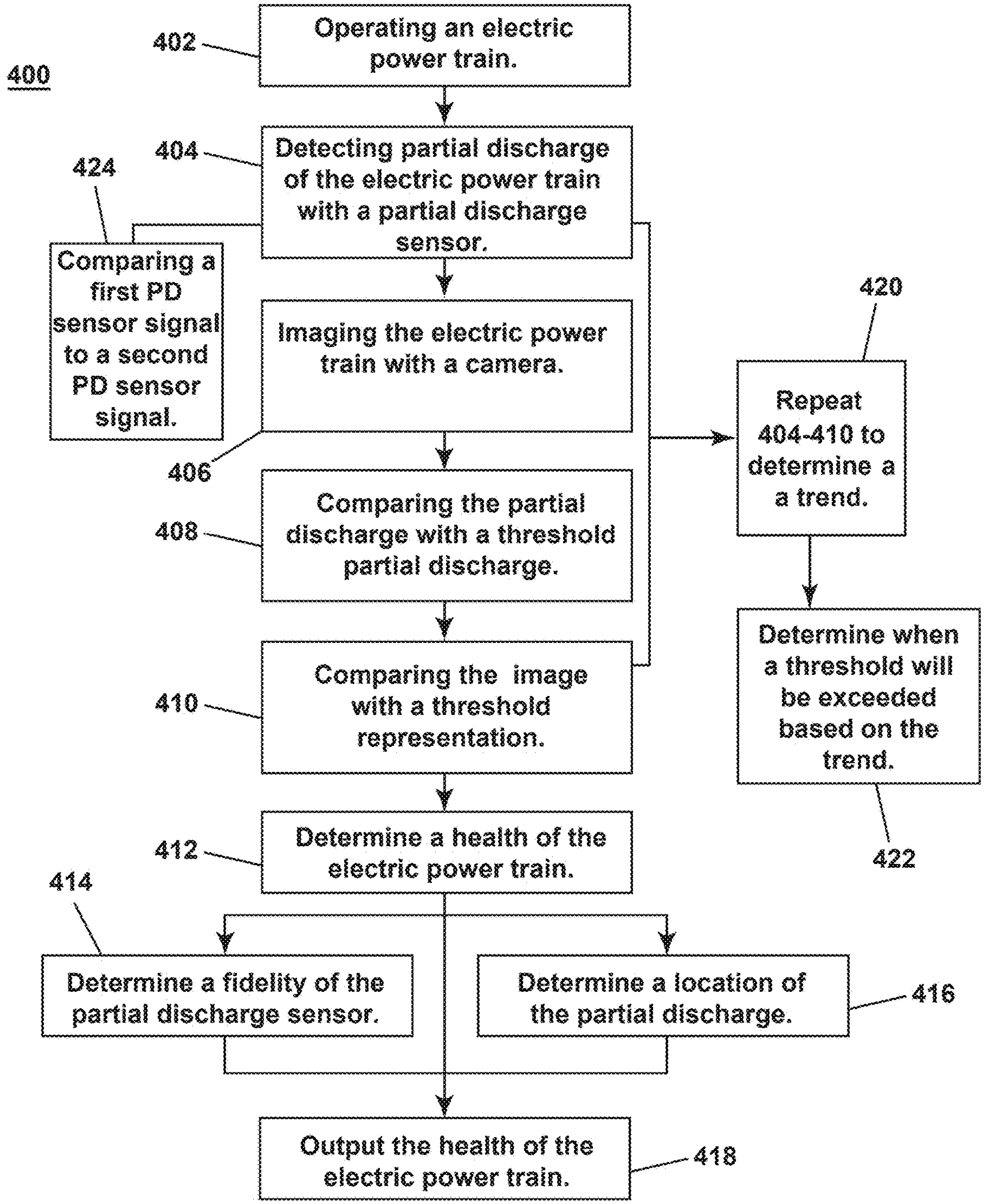
FIG. 8 is a flow chart depicting a method of monitoring the health of an electric power train, in accordance with various aspects described herein.

FIG. 8 shows a flow chart depicting a method 400 of monitoring the health of an electric power train, such as the electric power train 12 of FIG. 2. The method 400 can be performed or accomplished in real time, such as during use of the electric power train 12, or can be done after completion of use of the electric power train 12, or during an idle or non-operating condition while the electric power train 12 is still turned on or running.

At 402, the method 400 can include operating an electric power train, like the electric power train 12 of FIG. 2, or any electric component, element or feature of the electric power train 12. For example, a component of the electric power train 12 can be the generator 90 (FIG. 3) or the generator rotor 124 or the generator stator 126 of FIG. 4, which can be imaged by the camera 100 and the PD sensor 102 coupled to the generator 90. Where the electric power train 12 is a converter 52 (FIG. 2), components of the electric power train 12 can include semiconductors or capacitors within the converter 52, in non-limiting examples.

At 404, the method 400 can include detecting partial discharge of the electric power train 12 with a PD sensor, such as the PD sensor 102 of FIG. 3. The PD sensor 102 can detect any electrical discharge emitted from the electric power train 12 and generate a signal representative of such emitted electrical discharge. Such a signal can be provided from the PD sensor 102 to a controller, such as the controller 140 of FIG. 4. In non-limiting examples, the PD sensor 102 can be a PCB antenna, a RTD sensor, a thermocouple, a capacitive sensor, or an inductive sensor. In a non-limiting example, the PD sensor 102 can be positioned within a shielding structure, such as the housing of an electric machine of the electric power train 12, like the housing 92 of the electric machine 120 of FIG. 3. In another non-limiting example, such a shielding structure can be shielding insulation within the electric power train 12, and the PD sensor 102 can detect latent degradation of the electrical insulation through the detection of partial discharge. In additional non-limiting examples, the PD sensor 102 can be configured to detect arcing or corona within the electric power train 12. In another non-limiting example, multiple measurements can be made with the PD sensor 102 over time to define a trend or magnitude of electrical discharge measurements over time.

At 406, the method 400 can include imaging the electric power train 12 with a camera, such as the camera 100 of FIG. 4, like an infrared sensor or an ultraviolet sensor. Where the camera 100 is an infrared sensor or an ultraviolet sensor, the method 400 can include imaging the electric power train 12 with the infrared sensor or the ultraviolet sensor. Such a camera 100 can be provided in-situ on the electric power train 12, and being non-intrusive. Additionally, such a camera can provide a heat map of an area of the electric power train 12, as opposed to only a point of measurement, thereby reducing or mitigating the opportunity to miss excessive temperatures within the electric power train 12. The camera 100 can generate a signal representative of the temperature of the electric power train 12, an area thereof, or a region or component thereof. Such a signal can be provided from the camera 100 to the controller 140 (FIG. 4). In a non-limiting example, the camera 100 can measure the same position, area, or element of the electric power train 12 as that of the PD sensor 102. In a non-limiting example, imaging with the camera 100 can be used to generate a heat map of the area of the electric power train 12. In yet another non-limiting example, the camera 100 can be utilized to measure a temperature of the electric power train 12 over time. Such measurements can be utilized to determine a change in temperature over time. In one example, such a change can be associated with a loading condition of the turbine engine 10 or the electric power train 12. Furthermore, multiple measurements can be utilized to determine a temperature trend over time, or magnitude of the change in temperature. In another non-limiting example, the camera 100 can be utilized to determine a surface emissivity of the electric power train 12, or portions thereof. A comparison of surface emissivity to prior measurements of surface emissivity, by the controller 140, or to a threshold surface emissivity, can be used to determine aging and health of an electrical insulation system (EIS) for the electric power train 12. Changes in surface emissivity over time can indicate aging of the insulation for the electric power train 12, which can represent the health of the electric power train 12.

In a non-limiting example, the camera 100 and the PD sensor 102 can be distributed to measure different areas or portions of the electric power train 12. For example, the camera 100 can thermally image a first area or component of the electric power train 12, like the generator 90 of FIG. 2, and the PD sensor 102 can measure a second area or component of the electric power train 12, like the converter 52 or the inverter 54 of FIG. 2. Such a distributed arrangement can provide a more comprehensive indication of the health of the electric power train 12. A common arrangement, such as where the camera 100 and the PD sensor 102 are arranged at the same area or component can provide for determining a fidelity of the camera 100 or the PD sensor 102, such as that described at 414.

At 408, the method 400 can include comparing the measured partial discharge, detected with the PD sensor 102 with a partial discharge threshold. Such a comparison can be made with the controller 140, for example. In a non-limiting example, the partial discharge threshold can be any detected partial discharge, such that any detected partial discharge by the PD sensor 102 can meet or exceed the partial discharge threshold. In another non-limiting example, it is contemplated that at least some partial discharge is permitted within the electric machine 120 without meeting or exceeding the partial discharge threshold. Where the partial discharge is measured as a trend of partial discharges over time, as well as the magnitude of the change over time, the measurements can be extrapolated to determine when the partial discharge will exceed the partial discharge threshold.

At 410, the method 400 can include comparing the image, detected with the camera 100, with a threshold representation, such as a comparison of a measured heat map as imaged by the camera 100 with a threshold heat map stored in the memory 144. Where the camera 100 is an infrared camera, the method 400 at 410 can include comparing the image to a threshold infrared heat map, for example. Where the camera 100 is an ultraviolet camera, the method 400 at 410 can include comparing the image to an ultraviolet light intensity threshold. Such a threshold representation can be a heat map, or other representation of the electric power train 12, or portions or components thereof, which can be representative of temperatures of particular locations of the electric power train 12, for example, that can be compared with similar locations imaged by the camera 100. Such a comparison can be made with the controller 140, for example. Comparison of the image to a threshold representation can be utilized to determine open circuits, short circuits, thermal runaway, eccentricity, or bearing failure, in non-limiting examples. The image can be used to identify both excessive temperatures and the specific location or source thereof. Such a location or source can be beneficial in identifying health issues with specific components of the electric power train 12 associated with the location or source identifying excessive temperatures on the heat map. In an example where the temperature is provided as a temperature trend, such a trend, magnitude of change in temperature, or both, can be extrapolated over time to determine when such a measured temperature will exceed the temperature threshold.

At 412, the method 400 can include determining a health of the electric power train 12. Determining the health can be determined based upon whether the partial discharge threshold or the temperature threshold has been exceeded, as determined by the controller 140 at 408 or at 410. Additionally, determining the health of the electric power train 12 can include determining a health of particular areas or components of the electric power train 12. For example, where the PD sensor 102 or the camera 100 determines values exceeding a related threshold, the PD sensor 102 or the camera 100 can be utilized to determine a location or source where the threshold is met or exceeded, and is able to identify an element, part, or area of the electric power train 12 where such meeting or exceeding of a threshold is occurring. Such location or source information is useful in determining which portions or elements of the electric power train 12 are experiencing discharge or temperatures outside of specified thresholds, which can provide for tailored maintenance and inspection, as compared to inspection or maintenance of the entire electric power train 12. In non-limiting examples, such determining of the health of the electric power train 12 can further include at least one of spectrum analysis, wavelet analysis, deep learning, machine learning, or combinations thereof. More specifically, such analysis or learning can be utilized to determine if or when particular thresholds are met or exceeded, permitting an output representative to the health of the electric power train 12 based upon such analysis or learning. Such analysis or learning can be done by the controller 140, for example, or other processors or controllers receiving the measurements of the electric power train 12.

At 414, the method 400 can include determining a fidelity of the PD sensor 102 with the camera 100. More specifically, where areas of increased partial discharge occur within the electric power train 12, there is an expectation that related thermal increases would also occur at or near the same locations within the electric power train 12. Areas where partial discharge is being detected or not detected can be compared with the same areas by the camera 100 to determine if increases temperatures are also being detected or not detected, in order to determine if the measurements from the PD sensor 102 aligns with or otherwise agree with the measurements from the camera 100. Where such measurements are inconsistent, a health or fidelity of the PD sensor 102 can be included as part of determining the health of the electric power train 12.

At 416, the method 400 can include determining a location or source of the partial discharge. The PD sensor 102, or the controller 140 receiving measurements from the PD sensor 102, can determine the location or source within the electric power train 12 where such partial discharge is occurring. The controller 140 can include a map or other layout of the electric power train 12, such as being stored on the memory 144 (FIG. 4). Comparison or correlation, by the controller 140, of the map or other layout to a position on the electric power train 12 can be utilized to determine where such partial discharge is occurring, permitting the controller 140 to determine which part of the electric power train 12, or which element thereof, is experiencing such partial discharge. Such a location or source can also be confirmed by comparison with temperatures measured by the camera 100 for the same location of the electric power train 12. If the temperatures measured by the camera 100 do not correlate with the measurements of partial discharge, it may be an indication of diminished health of the PD sensor 102, similar to determining the fidelity of the PD sensor 102, discussed at 414.

At 418, the method 400 can include outputting the health of the electric power train 12. Such outputting can include displaying the health of the electric power train 12 on a display, like the display 146 of FIG. 4. Such an output can be an indication of good health, for example, where none of the thresholds have been exceeded. Other indications can be a display indicating that one or more thresholds have been exceeded, or displaying specific information related to the partial discharge or temperature of the electric power train 12. Other information that can be displayed includes, but is not limited to, the need for maintenance or inspection, or which portions of the electric power train 12 are experiencing the partial discharges or temperatures exceeding such thresholds. Additionally, the fidelity of the PD sensor 102, such as that determined at 414, can be included as part of outputting of the health of the electric power train 12. Such an output can be an indication that the fidelity is good, for example, or that the partial discharge measurements are inconsistent with the temperature measurements, indicating that the health of the PD sensor 102 may need maintenance or inspection.

At 420, the method 400 can include repeating the method 400 from 404 through 410. Such repetition can be used to determine multiple partial discharges and multiple temperatures over time in order to define a trend of partial discharges and temperatures over time, or the magnitude of such changes over time, or both. For example, each time the PD sensor 102 makes a measurement, each time the camera 100 makes a measurement, or both, those measurements can be stored and recorded for future use and historic comparison, such as on the memory 144 of FIG. 4. That set of measurements can be used to define the trend for the partial discharges and the temperatures of the electric power train 12 over time, as well as the magnitude of changes of the partial discharges and the temperatures.

At 422, the method 400 can include determining when one or both of the partial discharge threshold or the temperature threshold will be exceeded based upon the trends, the magnitudes thereof, or both. Where such a trend shows an increase in partial discharge or temperature over time, for example, such an increase, and its magnitude, can be extrapolated to anticipate when a particular partial discharge threshold or temperature threshold will be met or exceeded. Inspection or maintenance can be scheduled prior to when such an anticipated threshold will be met or exceeded in order to maintain good health for the electric power train 12. In this way, the method 400 can provide prognostic health monitoring for the electric power train 12.

At 424, the method 400 can include wherein the PD sensor 102 is provided as multiple PD sensors, and wherein the method 400 includes comparing a first signal from a first PD sensor to a second signal from a second PD sensor. For example, multiple PD sensors 102 can be utilized in measuring the electric power train 12, and may have overlap in areas of measurement of the electric power train 12, or may be arranged to measure the same component of the electric power train 12. In one example, the electric power train 12, or parts thereof, can be measured by at least two PD sensors 102. A signal from the first PD sensor, which has detected partial discharge, can be compared with a signal from a second PD sensor, which overlaps in measurement area with the first PD sensor that detected the partial discharge. The signal from the second PD sensor can be compared with the signal from the first PD sensor to confirm the measurement, as well as determine a health of the first or second PD sensor, which should have a similar signal confirming the detected partial discharge. An inconsistency among the signals between the first and second PD sensors can indicate that the health of one of the PD sensors has degraded, and may require maintenance or inspection. Additionally, multiple PD sensors enable a full mapping of any partial discharge occurring within the electric power train 12, which can be utilized to determine a location or source of the partial discharge, or help determine which side of a power cable the PD is coming from, for example.

The method 400 described herein permits in-situ measurement of both electric discharge and temperature of an electric power train, like the electric power train 12 of FIG. 2, which permits real time monitoring of the health condition of the electric machine 120. Distribution of multiple sensors permits coverage of certain components of the electric power train 12, as well as filtering or blocking of adverse signals by the use of multiple sensors, which can verify or confirm measurements by other sensors. Severe electrical conditions like arcing or corona can be prevented by detecting latent degradation of electric insulation, and requiring maintenance or inspection after detecting such latent degradation but prior to the occurrence of arcing or corona. Additionally, such in-situ monitoring can monitor health of the electric power train, measuring electrical, thermal, and mechanical health of the electric power train 12 by detecting events such as open circuits, short circuits, thermal runaway, eccentricity, or bearing failure in non-limiting examples. Multiple cameras 100 can be utilized to determine a heat map of the electric power train 12, which can be used to monitor the health of particular components or areas of the electric power train 12 through comparison with the heat map. Additionally, infrared cameras, such as the camera 100, can be used to determine a surface emissivity of the electric power train 12 or portions thereof. Changes in surface emissivity, such as those caused by discoloration, can be used to determine the health of the electric power train 12, such as where oxidative degradation of the electric insulation occurs. Real time measurements by the camera 100 and the PD sensor 102 permit real time analysis, including spectrum analysis, wavelet analysis, deep learning, machine learning, or combinations thereof. Such analysis provides comprehensive health monitoring for the electric power train 12, which can be accomplished in real time. Such comprehensive health monitoring can provide for monitoring of all or nearly all electrical, thermal, and mechanical failures within the electric power train 12. Furthermore, thermal monitoring, such as thermal tomography or heat mapping, can be used to measure fidelity of the PD sensor 102, as well as the location or source of electric discharge. Further yet, historic monitoring data, like the measurements made by the camera 100 and the PD sensor 102, can be stored to permit prognostic health management, such as by predicting when particular thresholds will be exceeded based upon changes in measurements over time. Such prognostic health management can further be used to predict remaining usable life for the electric power train 12, or components thereof, as well as considering the particular loading condition.

Benefits of the method and system as described herein include improved health monitoring and reporting for the electric power train 12 for the turbine engine 10. Electric demand can be high in a turbine engine environment, where such an environment may be harsh, subject to oily or contaminated environments that are subject to a wide range of temperature variation before, during, and after operation. The method and system herein takes advantage of a monitoring system utilizing both real-time partial discharge detection and thermal tomography.

Failure in electric machines is typically related to stator insulation and bearing failure events, which can account for up to 80-90% of the events. In situ thermal tomography can be utilized to measure temperatures at the rotor, the stator, and the bearings. As temperatures approach thresholds for the electric power train 12, the method and system can provide for indicating that a threshold has been exceeded, may be exceeded in the future, or where meeting or exceeding the threshold is imminent, and can indicate or schedule maintenance and inspection of the rotor, the stator, or the bearings before failure has occurred. Specific thresholds can be provided to alert that maintenance or inspection is needed before failure occurs, or values can be extrapolated over time to anticipate when failure may occur, permitting maintenance or inspection action prior to arriving at such an event.

Semiconductors and capacitors have some of the least reliability among electric components in power converters. Utilizing the PD sensor 102 permits measurement of such electrical components for the electrical power train by detecting partial discharge where degradation of the components may be occurring, which are typically or often associated with such partial discharge. Utilizing the PD sensor 102 permits identification of when such partial discharge begins to occur, which can provide health monitoring of such electrical components before health conditions may be readily apparent to other measurement systems, like that of the camera 100 measuring temperature changes, where such temperature changes may initially be small and short of reaching the thresholds set of the camera 100.

In this way, utilizing a combination of the camera 100 and the PD sensor 102 permits a comprehensive health monitoring system for the electric power train 12, capable of minoring areas where failure is likely to occur, as well as smaller or more delicate areas of the electric power train 12, such as semiconductors and capacitors, whose health is more-readily identified by the detection of partial discharge. Therefore, the system and method provides for comprehensive health monitoring of the electric power train 12 through monitoring of temperatures and partial discharges, as well as in real time.

Such health monitoring can increase overall flight performance, as well as that of the aircraft, turbine engine, and other related and interconnected components. Additionally, such monitoring permits improved maintenance and inspection, such as that being targeted to specific regions of the electric power train 12 or being indicated that maintenance or inspection is to be completed. In this way, maintenance and inspection costs can be minimized by indicating when such maintenance or inspection is needed, as well as reducing the physical inspection of the electric power train 12 required by an inspector, as inspection can be provided via measurements made by the PD sensor 102 and the camera 100. Furthermore, power system and electric power train life can be extended as well as reducing aircraft or turbine engine down time.

Figure 9:
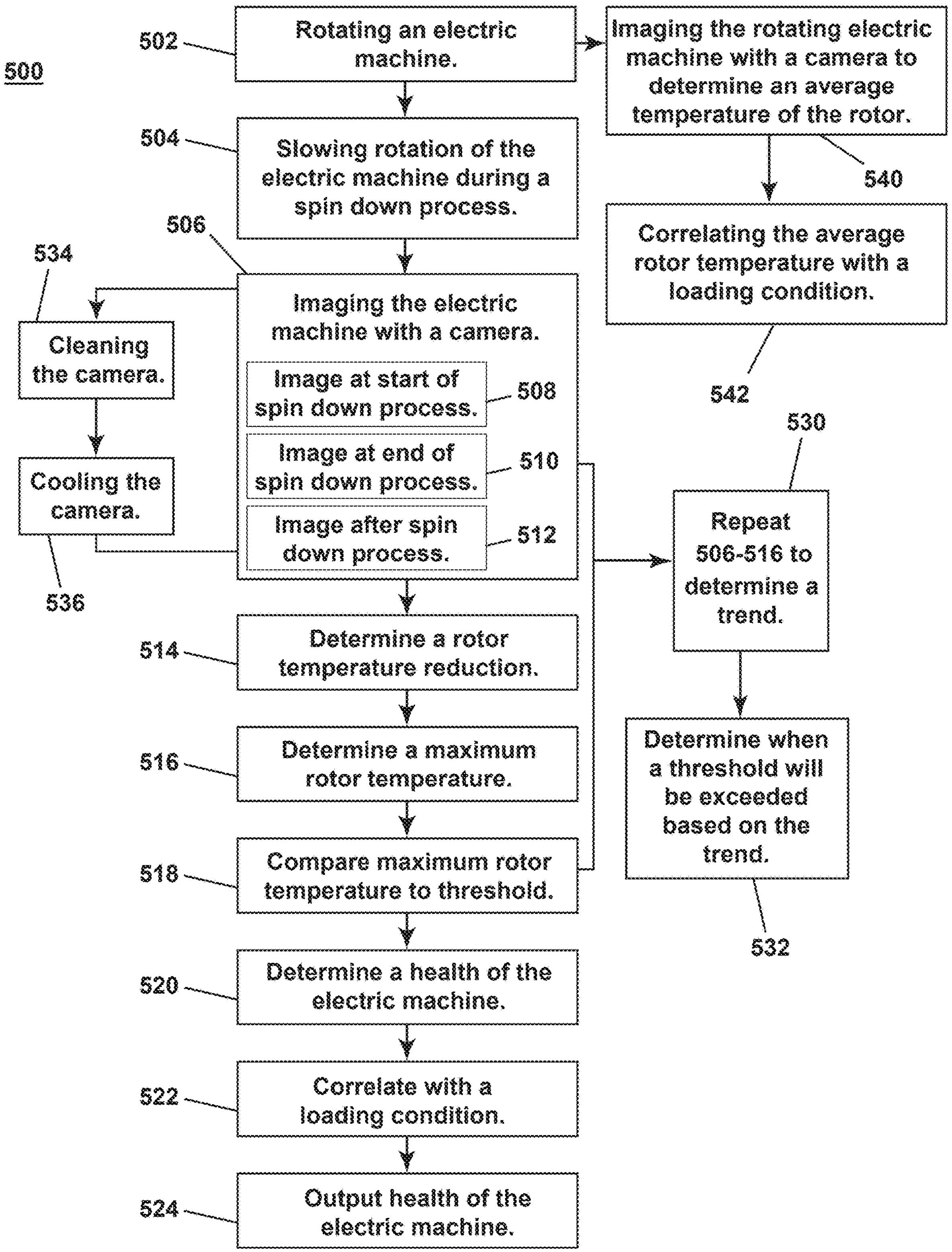
FIG. 9 is a flow chart depicting a method of determining the health of an electric machine, like the generator of FIG. 3, in accordance with various aspects described herein.

Referring to FIG. 9, a flow chart depicts a method 500 of determining the health of an electric power train or an electric machine for a turbine engine, such as the turbine engine 10 of FIG. 1, the electric power train 12 of FIG. 2, or the generator 90 or the electric machine 120 of FIGS. 3-4, and the method 500 will be described with respect to a rotating electric machine. At 502, the method 500 can include rotating the electric machine 120. For example, rotating the electric machine 120 can include rotating of the generator rotor 124 of FIG. 4 to generate an electric current. Aspects of the method 500 can be implemented with a controller, such as the controller 140 of FIG. 4, in a non-limiting example.

The rotating of the electric machine 120 can be slowed during a spin down process at 504, until the rotation eventually stops at the end of the spin down process. For example, rotation of the generator rotor 124 can cease when demand for supply of the electric current ceases, resulting in the initiation of the spin down process. The spin down process involves reducing the rotational speed of the generator rotor 124 until the rotation stops at the end of the spin down process.

A sensor, such as the camera 100 fixed to the generator 90 in FIGS. 3-4, can be positioned to image the electric machine 120, and portions thereof, such as rotating portions including but not limited to the generator rotor 124. Additionally, the camera 100 can image non-rotating portions of the electric machine 120, such as the generator stator 126 of FIG. 4 in a non-limiting example. It is contemplated that the camera 100 can be positioned to image any desired portion of the electric power train 12 or the electric machine 120 where temperature variation within the electric machine 120 can be utilized to determine health of the electric machine 120.

At 506, the method 500 can include imaging the electric machine 120 with the camera 100. More specifically, the camera 100 can image the generator rotor 124 during the spin down process. At 508, the camera 100 can image the generator rotor 124 at the start of the spin down process. Such a start of the spin down process can be at the initiation of the spin down process or just after initiation of the spin down process, such that imaging of the generator rotor 124 is at a rotational speed that is less than the rotational speed prior to initiation of the spin down process. Such imaging can be used to determine a first rotor temperature. At 510, the camera 100 can image the generator rotor 124 at the end of the spin down process. In non-limiting examples, the imaging can be done just prior to cessation of rotation of the rotor, such as less than one second or less than 0.25 seconds prior to cessation of rotation. Such imaging can be used to determine a second rotor temperature. At 512, the camera 100 can image the generator rotor 124 after the spin down process, after rotation of the generator rotor 124 has stopped. Such imaging can be used to determine a third rotor temperature. This can be done at or just after cessation of rotation of the generator rotor 124, such as less than one second or less than 0.25 seconds after cessation of rotation.

Imaging the electric machine 120 need not be limited to just first and second measurements determining a first and second rotor temperature. In a non-limiting example, multiple measurements can be performed during the spin down process, which can provide greater detail in determining the reduction in temperature of the rotor during the spin down process. In a non-limiting example, a set of measurements or a plurality of measurements can be made periodically during the spin down process.

At 514, the method 500 can include determining a rotor temperature reduction as the difference between the first temperature and the second temperature. The rotor temperature reduction is useful in determining how much the generator rotor 124 cools during the spin down process.

At 516, the method 500 can include determining a maximum rotor temperature for the generator rotor 124 or a maximum temperature for another area or component of the electric machine 120. The maximum rotor temperature can be determined as the summation of the rotor temperature reduction and the third rotor temperature. In this way, the method 500 utilizes a difference in temperatures measured during the spin down process to estimate a temperature change, and adds such a value for the temperature change to the measured temperature after the spin down process to determine a maximum temperature for the generator rotor 124.

The camera 100 can be a low-speed camera, such as a low-speed infrared camera. Such low-speed cameras can be advantageous over higher speed cameras, such as by reducing overall cost of the system and can be better suited for the harsh conditions of the turbine engine environment. During rotational operation of the generator rotor 124, rotational speeds can be too fast for the speed of the camera 100, such as the low-speed infrared camera, which can provide average temperature measurements or values resultant of a smearing of the temperature data measured by the camera 100, resulting from the fast rotational speeds. Once rotation has stopped, the camera 100 can image the generator rotor 124 without such smearing. In order to determine a maximum temperature for the generator rotor 124 during rotation, or a particular position of the generator rotor 124 during rotation, the rotor temperature reduction can be added to the temperature values measured after the generator rotor 124 has stopped, in order to determine the maximum rotor temperature during rotation, or at a particular position despite such fast rotation. In this way, accurate temperatures for the generator rotor 124, or portions thereof, can be determined during rotation of the generator rotor 124.

At 518, the method 500 can further include comparing the maximum rotor temperature, or maximum rotating machine temperature, to a threshold or threshold temperature. Such a threshold temperature can be a maximum temperature value for the electric machine 120, such as a maximum rated operating temperature. Comparison of the maximum rotor temperature to such a maximum rated operating temperature can be utilized to determine if the maximum rotor temperature exceeds such a maximum rated temperature, indicating that maintenance or inspection may be required. In another non-limiting example, the threshold temperature can be a temperature range, or can be multiple temperatures. More specifically, a temperature range can be a set of values where maintenance or inspection for the electric machine 120 may be recommended, but prior to reaching maximum temperature values exceed rated operational temperatures. Multiple temperatures can be utilized as the threshold temperature in order to indicate different health statuses for the electric machine 120 once the maximum rotor temperature reaches any one of the multiple temperatures, or can be utilized to represent the urgency of maintenance or inspection based upon which threshold is met.

At 520, the method 500 can further include determining a health of the electric machine 120. Determining the health of the electric machine 120 can be based upon the comparison of the maximum rotor temperature to the threshold. For example, if the maximum rotor temperatures do not exceed the threshold, the electric machine 120 can be considered healthy or having good health. Where maximum rotor temperatures meet or exceed any threshold or threshold range, the electric machine 120 can have a health condition that recommends or indicates inspection or maintenance, such as inspection needed or maintenance needed.

At 522, the method 500 can further include correlating the health of the electric machine 120 or the maximum rotor temperature with a loading condition. Loading on the electric machine 120 or the generator rotor 124 can vary based upon different conditions. For example, different loading conditions can include engine operating conditions, flight conditions, rotational speeds, or operating environments. These loading conditions can affect temperatures of the electric machine 120. Consideration of such loading conditions with the maximum rotor temperature can be used to anticipate where different loading conditions can result in temperatures exceeding the thresholds, which can be used to avoid excessive thresholds before they occur or provide maintenance or inspection prior to meeting or exceeding such thresholds.

At 524, the method 500 can further include outputting the health of the electric machine 120, such as to the display 146 of FIG. 4. Outputting the health can include an indication of the health of the electric machine 120, such as good health where no thresholds are met or exceeded. Where one or more thresholds are met or exceeded, such a report can be generated, which can be provided to the display 146 Additionally, the indication of the health can include indicating which element or portion of the electric machine 120 is exceeding the particular threshold. Additionally, an output can include an indication that inspection or maintenance of the electric machine 120 is needed, or scheduling such maintenance or inspection. Furthermore, outputting the health of the electric machine 120 can include outputting a health of the PD sensor 102, as determined based upon measurements of the camera 100. In a non-limiting example, outputting the health of the electric machine 120 can further include scheduling maintenance or inspection of the electric machine 120.

At 530, the method 500 can include repeating the method 500 from 506 through 516. Such repetition can be used to determine multiple maximum rotor temperatures in order to define a trend of temperature over time, the magnitude thereof, or both. At 532, the method 500 can include determining when a threshold will be exceeded based upon the trend, the magnitude, or both. Where such a trend shows an increase in temperature over time, for example, such an increase, such as at a determined magnitude, can be extrapolated to anticipate when a particular temperature threshold will be met or exceeded. Inspection or maintenance can be scheduled prior to when such an anticipated threshold will be met or exceeded in order to maintain good health for the electric machine 120. In this way, the method 500 can provide prognostic health monitoring for the electric machine 120.

At 534, the method 500 can optionally include cleaning the camera 100. For example, a curtain of air provided from the air circuit within the camera 100, such as the air circuit 230 of FIG. 6. The curtain of air can be provided across the lens 220 (FIG. 6) of the camera 100 to clear any oil, debris, or contaminants that may otherwise obscure the view of the camera 100. Such a curtain of air permits the use of the camera 100 within the harsh and oily environment of the generator 90 or the electric machine 120.

At 536, the method 500 can optionally include cooling the camera 100. For example, a supply of air provided from the air circuit 230 within the camera 100. The supply of air cools the camera 100 to permit operation within high-temperature environments, such as those of the turbine engine 10 or the generator 90.

At 540, the method 500 can further include imaging the rotating electric machine with a camera to determine an average temperature of the rotor. The camera can be the camera 100 fixed to the generator 90 in FIGS. 3-4, for example, and can be positioned to image the rotor or rotating portions of the electric machine 120, including but not limited to the generator rotor 124 of FIG. 4. During rotational operation of the rotor, rotational speeds can be too fast for the speed of the camera 100, such as the low-speed infrared camera, which can provide average temperature measurements or values resultant of a smearing of the temperature data measured by the camera 100, resulting from the fast rotational speeds. Such smearing provides for an average rotor temperature for the rotor, which can be measured by the camera 100.

At 542, the method 500 can further include correlating the average rotor temperature with a loading condition to determine a health of the rotor or the electric machine 120. Different loading conditions can result in different temperatures for the rotor, based upon the loading condition, which result in different average rotor temperatures. Loading conditions can include, but are not limited to, electrical loading, an operating condition like engine operating conditions, flight conditions, rotational speeds, or operating environments. Electric loading can include power, current, or demand, in non-limiting examples. Engine operating conditions can include, but are not limited to, start-up, idle, taxi, takeoff, climb, cruise, descend, and land. Flight conditions can include, in non-limiting examples, flight path, altitude, geography, air temperature, air pressure, or weather. Rotational speeds can be the rotational speed of the rotating elements of the electric power train 12 or the electric machine 120, such as the generator rotor 124 or the turbine engine 10 (FIG. 1), in non-limiting examples. Operating environments can include, in non-limiting examples, geography or air quality, such as sandy, humid, or dusty environments. Furthermore, it is contemplated that the electric machine 120, or rotor thereof, is actively cooled during operation. Loading conditions can be determined based upon the demand for cooling of the electric machine 120.

Said different loading conditions result in different temperatures across the rotor, such as relatively greater temperatures during relatively greater loading conditions, and relatively lesser temperatures during lesser loading conditions. The average rotor temperatures can be extrapolated across different loading conditions, particularly those anticipated to be experienced by the particular electric machine 120 or rotor during operation, in order to anticipate when a threshold may be exceeded under such different operating conditions, while not exceeding similar thresholds under alternate or current operating conditions.

In a non-limiting example, a measurement made by the camera 100 can be correlated with current or anticipated loading conditions in order to determine or anticipate a system health for the electric power train 12, the electric machine 120, or rotor at different loading conditions. For example, when the average rotor temperature is determined by a controller, like the controller 140 of FIG. 4, to be near a certain threshold that may be exceeded upon changing the loading condition, the controller 140 can then indicate or otherwise provide a message that such a threshold is expected to be met or exceeded, or will be met or exceeded during a particular loading condition, the controller 140, or other operator, such as a pilot or remote flight controller, can take action to avoid such a loading condition, can modify a different loading condition so that the average rotor temperature remains below the threshold upon changing loading conditions, can schedule or indicate needed inspection or maintenance, or even update or change the loading conditions (where available) in order to decrease or maintain the average surface temperature to be below the threshold across the different loading conditions.

For example, where a rotor is experiencing minimal loading, such as during idle, the average rotor temperature can be extrapolated to increased loading conditions, such as during takeoff or flight, to determine if the average rotor temperature is expected to exceed the threshold upon changing the loading to takeoff of flight. Additionally, the threshold may be extrapolated based upon the different loading conditions, where different loading conditions can determine different acceptable thresholds. Remedial action can be taken to maintain the average rotor temperature below the threshold or across extrapolated thresholds prior to changing to the different loading condition. Such rates or values for extrapolating temperatures across different loading conditions can be stored within the controller 140, such as within the memory 144. In a non-limiting example, the variations in average rotor temperature across different loading conditions can be stored in the memory 144 and updated by the controller 140 over time, thereby accounting for changes in the electric power train 12 or the electric machine 120 over time.

In another non-limiting example, the average rotor temperature can be compared with or otherwise correlated with a particular radius for a rotor. For example, a local hot spot on a rotor measured by the camera 100 will smear in a circular direction at a common radius. Such a measured average rotor temperature can be correlated across the full radial extent of the rotor to identify a local increased average rotor temperature at a particular radius. Identification can be achieved by comparison to known average rotor temperature across the whole radius, or at particular radial distances, which can be stored by the memory 144 and compared by the controller 140, for example. Knowing the particular radial position for an increase in temperature can be used to correlate the particular radial location with the rotor and related structure to diagnose or assist in diagnosing the position or source of the increase in temperature. For example, if a rotor temperature near a bearing (like the bearing 128 of FIG. 4) becomes increased relative to expected temperatures, the method 500 can be beneficial in diagnosing the source of the increased temperatures as the bearing. Therefore, it can be appreciated that determining the temperatures at particular radial locations of the rotor is beneficial in determining the health of the electric power train 12 or the electric machine 120, as well as diagnosing the source of increased temperatures.

Benefits of the system and method 500 described herein include non-intrusive, in-situ monitoring of the health of the electric power train 12 and the electric machine 120. This can provide anomaly detection capability. The system and method 500 further permits measurement and determining of the maximum temperature of the generator rotor 124 while in operation, despite the smearing of temperature data while the generator rotor 124 is rotating. Additionally, rotor hot spot detection is permitted. Such a method permits IR sensors as the camera 100, which are more cost-effective than other sensors and have faster response times, such as faster than that of a thermocouple. Additionally, IR sensors are typically smaller and less expensive than other sensors, minimizing cost and weight impact to the system. The camera 100 is well suited for use in the hot and oily environment resultant of the air circuit 230, having the benefit of the air circuit 230 to cool the camera 100 as well as to clear oil or other contaminants from the lens 220. This system and method permits health monitoring for high-value electric power trains 12, electric machines 120, or components thereof, as well as improved performance.

The method 500 also permits consideration of temperatures of the electric power train 12, the electric machine 120, or generator rotor 124 during different loading conditions or rotating speeds. This permits extrapolation of the temperatures to different loading conditions to determine if changes in loading conditions may result in temperature thresholds being met or exceeded. Similarly, a trend of temperatures for the generator rotor 124, or particular portions thereof, taken over time, can be used to predict or estimate when such thresholds may be exceeded. This permits prognostic health monitoring for the electric power train 12, the electric machine 120, or generator rotor 124 over time and at different loading conditions, in order to predict or estimate when a threshold may be met or exceeded, as well as indicating or scheduling action prior to when that threshold may be met or exceeded. Such action can be maintenance or inspection, for example.

Additionally, design validation and optimization, as well as product inspection, can be facilitated with the method and apparatus as described. More specifically, designs can be validated or optimized utilizing measurements from the camera 100 to determine temperature values for portions of the electric power train or the electric machine design are within expected ranges or values, as well as identify areas where heightened temperatures occur.

The sequences described in this disclosure are for understanding purposes only and is not meant to limit aspects of the disclosure or the applicable methods of applying aspects of the disclosure in any way as it is understood that the portions of the method can proceed in a different logical order, additional or intervening portions can be included, or described portions of the methods can be divided into multiple portions, or described portions of the method can be omitted without detracting from the described method. Additionally, different aspects from different method described herein, such as the methods 300, 400, 500 of FIGS. 7-9, can be intermixed or utilize aspects from two or more methods to create new methods, as will be understood by one having ordinary skill in the art.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the disclosure are provided by the subject matter of the following clauses:

A health monitoring system for a turbine engine, the health monitoring system comprising: an electric power train; a camera positioned to image the electric power train, the camera comprising: a camera housing having an imaging end with an end wall; a lens positioned at or within the end wall; and an air circuit passing through the end wall and positioned to direct a supply of air along or at the lens.

The health monitoring system of any preceding clause, wherein the camera housing is cylindrical.

The health monitoring system of any preceding clause, wherein the camera housing extends beyond the end wall and includes an interior surface defining a cavity at the end wall.

The health monitoring system of any preceding clause, wherein the interior surface defines a set of channels provided in the interior surface.

The health monitoring system of any preceding clause, wherein the camera housing defines a set of outlets extending through the camera housing.

The health monitoring system of any preceding clause, further comprising a drainage basin provided within the interior surface.

The health monitoring system of any preceding clause, wherein the air circuit defines a first curtain passage oriented to direct the supply of air from the end wall and along or at the lens.

The health monitoring system of any preceding clause, wherein the air circuit defines a second curtain passage positioned to receive the supply of air provided from the first curtain passage along or at the lens.

The health monitoring system of any preceding clause, wherein the air circuit defines an end wall aperture extending through the end wall at the lens.

The health monitoring system of any preceding clause, wherein the end wall aperture fluidly couples the first curtain passage to the second curtain passage.

The health monitoring system of any preceding clause, further comprising a drainage basin positioned within the body at the end wall.

The health monitoring system of any preceding clause, further comprising a drainage passage extending through at least one of the end wall or the body fluidly coupling the drainage basin to the second curtain passage.

The health monitoring system of any preceding clause, wherein the air circuit further includes an inlet passage extending through the end wall fluidly coupling an interior of the camera to the first curtain passage.

The health monitoring system of any preceding clause, wherein the air circuit further includes, in serial flow relationship: an inlet passage; a first curtain passage extending from the inlet passage and oriented to exhaust along or at the lens; an end wall aperture extending through the end wall at the lens; and a second curtain passage positioned to receive the supply of air from the end wall aperture, the second curtain passage spaced from the first curtain passage by the end wall aperture.

The health monitoring system of any preceding clause, wherein the lens is at least partially mounted within the end wall.

The health monitoring system of any preceding clause, further comprising a sensor configured to receive electromagnetic radiation focused by the lens.

The health monitoring system of any preceding clause, wherein the sensor is an infrared sensor.

The health monitoring system of any preceding clause wherein the electric power train comprises an electric machine.

A camera for imaging an electric machine, the camera comprising: a housing having an imaging end with an end wall; a lens positioned at or within the end wall; and an air circuit passing through the end wall and positioned to direct a supply of air along or at the lens.

The camera of any preceding clause, wherein the camera housing is cylindrical.

The camera of any preceding clause, wherein the camera housing extends beyond the end wall and includes an interior surface defining a cavity at the end wall.

The camera of any preceding clause, further comprising a set of channels provided in the interior surface.

The camera of any preceding clause, further comprising a set of outlets extending through the camera housing that extends beyond the end wall.

The camera of any preceding clause, further comprising a drainage basin provided within the interior surface.

The camera of any preceding clause, wherein the air circuit further includes a first curtain passage oriented to direct the supply of air from the end wall and along or at the lens.

The camera of any preceding clause, wherein the air circuit further includes a second curtain passage positioned to receive the supply of air provided from the first curtain passage along or at the lens.

The camera of any preceding clause, wherein the air circuit further includes an end wall aperture extending through the end wall at the lens.

The camera of any preceding clause, wherein the end wall aperture fluidly couples the first curtain passage to the second curtain passage.

The camera of any preceding clause, further comprising a drainage basin provided within the body at the end wall.

The camera of any preceding clause, further comprising a drainage passage extending through at least one of the end wall or the body fluidly coupling the drainage basin to the second curtain passage.

The camera of any preceding clause, wherein the air circuit further includes an inlet passage extending through the end wall fluidly coupling an interior of the camera to the first curtain passage.

The camera of any preceding clause, wherein the air circuit further includes, in serial flow relationship: an inlet passage; a first curtain passage extending from the inlet passage and oriented to exhaust along or at the lens; an end wall aperture extending through the end wall at the lens; and a second curtain passage positioned to receive the supply of air from the end wall aperture, the second curtain passage spaced from the first curtain passage by the end wall aperture.

The camera of any preceding clause, wherein the lens is at least partially mounted within the end wall.

The camera of any preceding clause, further comprising a sensor configured to receive electromagnetic radiation focused by the lens.

The camera of any preceding clause, wherein the sensor is an infrared sensor.

A method of imaging an electric power train, the method comprising: imaging the electric power train with a camera; passing a supply of air along an air circuit within the camera; and removing oil or contaminants from the camera along the air circuit.

The method of any preceding clause, further comprising cleaning the oil or contaminants from a lens of the camera.

The method of any preceding clause, further comprising cooling the camera with the air circuit.

The method of any preceding clause, further comprising redirecting oil or contaminants from the camera with a set of channels provided within an interior surface defining a cavity at the camera.

The method of any preceding clause, further comprising gathering the oil or contaminants within a drainage basin.

The method of any preceding clause, further comprising passing the oil or contaminants within the drainage basin to the air circuit through a drainage passage.

A method of monitoring a health of an electric power train, the method comprising: detecting a partial discharge within the electric power train with a partial discharge sensor; imaging the electric power train with a camera to generate an image; comparing the detected partial discharge with a partial discharge threshold; comparing the image of the electric power train to a threshold representation; and determining the health of the electric power train based upon the detection of the partial discharge and the image of the electric power train.

The method of any preceding clause, further comprising outputting an indication of the health of the electric power train.

The method of any preceding clause, wherein outputting the health of the electric power train further comprises displaying the health of the electric power train on a display.

The method of any preceding clause, wherein outputting the indication further comprises outputting that a threshold has been met or exceeded when either the detected partial discharge meets or exceeds the partial discharge threshold or the image of the electric power train meets or exceeds the threshold representation.

The method of any preceding clause, further comprising displaying the indication on a display.

The method of any preceding clause, wherein the camera is an infrared camera or an ultraviolet camera.

The method of any preceding clause, wherein the camera is an ultraviolet camera, and wherein outputting the indication further comprises outputting the indication that the image exceeds an ultraviolet light intensity threshold.

The method of any preceding clause, wherein the camera is an infrared camera, and wherein imaging the electric power train further comprises thermally imaging the electric power train.

The method of any preceding clause, wherein detecting partial discharge and imaging the electric power train are at a same location within the electric power train.

The method of any preceding clause, wherein the electric power train is an electric machine, wherein detecting the partial discharge within the electric power train further comprises detecting partial discharge within the electric machine, wherein imaging the electric power train further comprises imaging the electric machine, and wherein the electric machine is one of a generator, a starter, a motor, or a transformer.

The method of any preceding clause, wherein the electric power train is the generator, and wherein determining the health of the electric power train further comprises determining at least one of a rotor health for a generator rotor, a stator insulation health for a generator stator, or a bearing health for a bearing.

The method of any preceding clause, wherein the electric power train is the converter, and wherein determining the health of the electric power train further comprises determining the health of at least one of semiconductors or capacitors within the converter.

The method of any preceding clause, wherein the partial discharge sensor is at least one of a PCB antenna, a RTD sensor, a thermocouple, a capacitive sensor, or an inductive sensor.

The method of any preceding clause, wherein the partial discharge sensor is positioned within a shielding structure of the electric power train.

The method of any preceding clause, wherein the shielding structure is provided within a housing of the electric power train.

The method of any preceding clause, wherein the electric power train comprises at least some electrical insulation, and wherein detecting partial discharge further comprises detecting electrical insulation latent degradation based upon the detected partial discharge.

The method of any preceding clause, wherein detecting partial discharge further comprises detecting arcing or corona within the electric power train.

The method of any preceding clause, further comprising determining at least one of an open circuit, a short circuit, a thermal runaway, an eccentricity, or a bearing failure by comparing the image to the threshold representation.

The method of any preceding clause, wherein imaging the electric power train further comprises determining a heat map of the electric power train.

The method of any preceding clause, wherein comparing the image of the electric power train to the threshold representation further comprises comparing the heat map to a threshold heat map to determine the health of the electric power train based upon temperature differences between the heat map and the threshold heat map.

The method of any preceding clause, wherein imaging the electric power train further comprises measuring a surface emissivity.

The method of any preceding clause, further comprising comparing the surface emissivity with the detected partial discharge to determine fidelity of the partial discharge sensor.

The method of any preceding clause, further comprising determining degradation of an insulation of the electric power train based upon the surface emissivity.

The method of any preceding clause, wherein imaging the electric power train further comprises determining a change in the temperature over time.

The method of any preceding clause, wherein imaging further comprises imaging over time to determine a temperature trend.

The method of any preceding clause, further comprising determining when a temperature will exceed the threshold temperature representation based upon the temperature trend.

The method of any preceding clause, wherein detecting partial discharge further comprises detecting partial discharge over time to define a partial discharge trend.

The method of any preceding clause, further comprising determining when the partial discharge will exceed the partial discharge threshold based upon the partial discharge trend.

The method of any preceding clause, wherein the partial discharge threshold is zero partial discharge.

The method of any preceding clause, wherein determining the health of the electric power train is completed in real time.

The method of any preceding clause, where determining the health of the electric power train is done after operation of the electric power train.

The method of any preceding clause, wherein determining the health of the electric power train further comprises at least one of spectrum analysis, wavelet analysis, deep learning, machine learning, or combinations thereof.

The method of any preceding clause, wherein detecting partial discharge within the electric power train with a partial discharge sensor further comprises detecting partial discharge with at least two partial discharge sensors at a common location to generate a first signal and a second signal.

The method of any preceding clause, further comprising comparing the first signal to the second signal to determine fidelity for the at least two partial discharge sensors.

A health monitoring system for an electric power train, the health monitoring system comprising: a partial discharge sensor coupled to the electric power train and positioned to measure the electric power train and configured to generate a signal representative of partial discharge within the electric power train; a camera coupled to the electric power train and positioned to image the electric power train and configured to generate a signal representative of a temperature of the electric power train; a controller operatively and communicatively coupled to the partial discharge sensor and the camera to receive the signal representative of the partial discharge and the signal representative of the temperature, the controller configured to: compare partial discharge detected by the partial discharge sensor to a partial discharge threshold; compare the temperature detected by the camera to a temperature threshold; and determine a health of the electric power train based upon the comparison of the partial discharge to the partial discharge threshold and based upon the comparison of the temperature to the temperature threshold.

The health monitoring system of any preceding clause, wherein the controller is further configured to output the health of the electric power train.

The health monitoring system of any preceding clause, further comprising a display configured to display the output health of the electric power train.

The health monitoring system of any preceding clause, wherein the electric power train is an electric machine comprising one of a generator, a starter, a motor, or a transformer.

The health monitoring system of any preceding clause, wherein the electric machine is the generator, and wherein the controller is further configured to determine the health of at least one of a rotor health, a stator insulation health, or a bearing health of the generator.

The health monitoring system of any preceding clause, wherein the electric power train is a converter, and wherein the controller is further configured to determine the health of at least one of semiconductors or capacitors within the converter.

The health monitoring system of any preceding clause, wherein the partial discharge sensor is at least one of a PCB antenna, a RTD sensor, a thermocouple, a capacitive sensor, or an inductive sensor.

The health monitoring system of any preceding clause, wherein the health monitoring system further comprises a housing with a shielding structure provided on the electric power train, and wherein the partial discharge sensor is positioned within the shielding structure.

The health monitoring system of any preceding clause, wherein the electric power train comprises at least some electrical insulation, and wherein the controller is configured to detect electrical insulation latent degradation based upon the comparison of the partial discharge with the partial discharge threshold.

The health monitoring system of any preceding clause, wherein the controller is further configured to determine at least one of an open circuit, a short circuit, a thermal runaway, an eccentricity, or a bearing failure by the comparison of the temperature to the temperature threshold.

The health monitoring system of any preceding clause, wherein the controller is further configured to generate a heat map of the electric power train based upon the signal representative of the temperature of the electric power train.

The health monitoring system of any preceding clause, wherein the controller is further configured to compare the heat map to a threshold heat map as the temperature threshold to determine health of the electric power train based upon temperature differences between the heat map and the threshold heat map.

The health monitoring system of any preceding clause, wherein the controller is further configured to determine a surface emissivity of the electric power train based upon the signal representative of the temperature of the electric power train.

The health monitoring system of any preceding clause, wherein the controller is further configured to compare the surface emissivity with the signal representative of the partial discharge to determine fidelity of the partial discharge sensor.

The health monitoring system of any preceding clause, wherein the controller is configured to determine a location or source of the partial discharge based upon the surface emissivity.

The health monitoring system of any preceding clause, wherein the controller is further configured to determine multiple signals representative of the temperature of the electric power train over time.

The health monitoring system of any preceding clause, wherein the controller is further configured to determine a temperature trend based upon the multiple signals representative of the temperature of the electric power train.

The health monitoring system of any preceding clause, further comprising determining when a measured temperature will exceed the temperature threshold based upon the temperature trend.

The health monitoring system of any preceding clause, wherein the controller is further configured to determine a partial discharge trend based upon the multiple signals representative of the partial discharge of the electric power train.

The health monitoring system of any preceding clause, further comprising determining when a measured partial discharge will exceed the partial discharge threshold based upon the partial discharge trend.

The health monitoring system of any preceding clause, wherein the controller is configured to determine the health of the electric power train in real time.

The health monitoring system of any preceding clause, wherein the controller is further configured to determine the health of the electric power train further with at least one of spectrum analysis, wavelet analysis, deep learning, machine learning, or combinations thereof.

A method of imaging an electric machine, the method comprising: rotating a rotor spaced from a stator to generate an electric current; slowing rotation of the rotor during a spin down process; imaging the rotor at a start of the spin down process to determine a first rotor temperature; imaging the rotor at an end of the spin down process to determine a second rotor temperature; determining a rotor temperature reduction as a difference between the first rotor temperature and the second rotor temperature; imaging the rotor after the end of the spin down process to determine a third rotor temperature; and determining a maximum rotor temperature as a summation of the third rotor temperature and the rotor temperature reduction.

The method of any preceding clause, wherein the electric machine is a generator.

The method of any preceding clause, further comprising comparing the maximum rotor temperature to a threshold temperature.

The method of any preceding clause, further comprising determining a health of the generator based upon the comparison of the maximum rotor temperature to the threshold temperature.

The method of any preceding clause, further comprising outputting at least one of the maximum rotor temperature or the health of the generator to a display.

The method of any preceding clause, wherein determining the maximum rotor temperature is determined each time the rotor is slowed during the spin down process to determine a trend of the maximum rotor temperature over time.

The method of any preceding clause, further comprising determining when the maximum rotor temperature will exceed a threshold temperature based upon the trend.

The method of any preceding clause, further comprising scheduling maintenance for the generator prior to when the maximum rotor temperature is evaluated to exceed the threshold temperature based on the trend.

The method of any preceding clause, further comprising imaging the stator at the start of the spin down process to determine a first stator temperature; imaging the stator at the end of the spin down process to determine a second stator temperature; determining a stator temperature reduction as a difference between the first stator temperature and the second stator temperature; imaging the stator after the end of the spin down process to determine a third stator temperature; and determining a maximum stator temperature as a summation of the third stator temperature and the stator temperature reduction.

The method of any preceding clause, further comprising comparing the maximum stator temperature to a threshold stator temperature.

The method of any preceding clause, further comprising determining the health of the generator by comparing the maximum stator temperature to the threshold stator temperature.

The method of any preceding clause, wherein the imaging of the rotor is completed with a camera mounted to the generator.

The method of any preceding clause, wherein the camera is an infrared camera.

The method of any preceding clause, further comprising cleaning the camera with an air curtain provided by an air circuit passing through the camera.

The method of any preceding clause, further comprising cooling the camera with a supply of air provided by an air circuit passing through the camera.

The method of any preceding clause, wherein imaging the rotor further comprises determining an emissivity of the rotor.

The method of any preceding clause, wherein imaging the rotor further comprising imaging the rotor a plurality of times during the spin down process.

The method of any preceding clause, wherein imaging the rotor the plurality of times further comprises imaging the rotor after the start of the spin down process and before the end of the spin down process.

The method of any preceding clause, further comprising correlating the maximum rotor temperature with a loading condition for the rotor to determine the health of the generator.

The method of any preceding clause, wherein the loading condition for the rotor is at least one of engine operating conditions, flight conditions, rotational speeds of the rotor, or operating environment.

The method of any preceding clause, further comprising comparing the maximum rotor temperature correlated to the loading condition to a threshold temperature also correlated to the loading condition.

The method of any preceding clause, wherein the health of the generator is based upon the comparison of the maximum rotor temperature correlated to the loading condition to the threshold temperature correlated to the loading condition.

The method of any preceding clause, further comprising stopping rotation of the rotor prior to imaging the rotor after the end of the spin down process.

The method of any preceding clause, further comprising outputting the maximum rotor temperature of the generator.

The method of any preceding clause, further comprising outputting the maximum rotor temperature of the generator.

The method of any preceding clause, further comprising outputting the maximum rotor temperature to a display.

A method of determining a health of a rotating machine for an electric machine, the method comprising: slowing a rotation of the rotating machine during a spin down process; imaging the rotating machine, with a camera, at a start of the spin down process to determine a first temperature of the rotating machine; imaging the rotating machine, with the camera, at an end of the spin down process to determine a second temperature of the rotating machine; determining, with a controller, a temperature reduction as a difference between the first temperature and the second temperature; imaging, with the camera, a third temperature of the rotating machine after the end of the spin down process; and comparing a maximum rotating machine temperature, defined as a summation of the third temperature and the temperature reduction, to a threshold temperature to determine the health of the rotating machine.

The method of any preceding clause, wherein determining the maximum rotating machine temperature is determined each time the rotating machine is slowed during the spin down process to determine a trend of the maximum rotating machine temperature over time.

The method of any preceding clause, further comprising evaluating when the maximum rotating machine temperature will exceed the threshold temperature based upon the trend.

The method of any preceding clause, further comprising scheduling maintenance for the rotating machine prior to when the maximum rotating machine temperature is evaluated to exceed the threshold temperature based on the trend.

The method of any preceding clause, wherein the camera is provided as a set of multiple cameras.

The method of any preceding clause, wherein the camera is an infrared camera.

The method of any preceding clause, further comprising cleaning the camera with an air curtain provided by an air circuit passing through the camera.

The method of any preceding clause, further comprising cooling the camera with a supply of air provided by an air circuit passing through the camera.

The method of any preceding clause, wherein imaging the rotating machine further comprises determining an emissivity of the rotating machine.

The method of any preceding clause, wherein imaging the rotor further comprises imaging the rotor multiple times during the spin down process.

The method of any preceding clause, wherein imaging the rotor multiple times further comprises imaging the rotor after the start of the spin down process and before the end of the spin down process.

The method of any preceding clause, further comprising correlating the maximum rotating machine temperature with a loading condition for the rotating machine to determine the health of the rotating machine.

The method of any preceding clause, wherein the loading condition for the rotating machine is at least one of engine operating conditions, flight conditions, rotational speeds of the rotating machine, or operating environment.

The method of any preceding clause, wherein corelating the maximum rotor temperature with the loading condition further comprises comparing the maximum rotating machine temperature correlated to the loading condition to the threshold temperature also correlated to the loading condition.

The method of any preceding clause, wherein the health of the rotating machine is based upon the comparison of the maximum rotor temperature correlated to the loading condition to the threshold temperature also correlated to the loading condition.

The method of any preceding clause, further comprising stopping rotation of the rotating machine prior to imaging the rotating machine after the end of the spin down process.

A health monitoring system for an electric machine, the health monitoring system comprising: a rotor; a camera coupled to the electric machine and positioned to image the rotor to generate a signal representative of a temperature of the rotor; a controller operatively and communicatively coupled to the camera, the controller configured to: image the rotor for the electric machine at a start of a spin down process to determine a first rotor temperature; image the rotor at an end of the spin down process to determine a second rotor temperature; determine a rotor temperature reduction as a difference between the first rotor temperature and the second rotor temperature; image the rotor after the end of the spin down process to determine a third rotor temperature; determine a maximum rotor temperature as a summation of the third rotor temperature and the rotor temperature reduction; and determine a health of the electric machine by comparing the maximum rotor temperature to a threshold temperature.

The health monitoring system of any preceding clause, wherein the controller is further configured to determine the maximum rotor temperature each time the rotor is slowed during the spin down process to determine a trend of the maximum rotor temperature over time.

The health monitoring system of any preceding clause, wherein the controller is further configured to evaluate when the maximum rotor temperature will exceed the threshold temperature based on the trend.

The health monitoring system of any preceding clause, wherein the controller is further configured to schedule maintenance for the electric machine prior to when the maximum rotor temperature is evaluated to exceed the threshold temperature based on the trend.

The health monitoring system of any preceding clause, wherein the controller is further configured to compare a maximum stator temperature to a threshold stator temperature.

The health monitoring system of any preceding clause, wherein the health of the electric machine is based upon the comparison of the maximum rotor temperature to the threshold temperature and the comparison of the maximum stator temperature to the threshold stator temperature.

The health monitoring system of any preceding clause, wherein the camera is an infrared camera.

The health monitoring system of any preceding clause, wherein the camera further comprises an air circuit configured to clean the camera with an air curtain provided by the air circuit passing through the camera.

The health monitoring system of any preceding clause, wherein the camera further comprises an air circuit extending through the camera and configured to cool the camera.

The health monitoring system of any preceding clause, wherein the controller is further configured to determine an emissivity of the rotor.

The health monitoring system of any preceding clause, wherein the controller is further configured to correlate the maximum rotor temperature with a loading condition for the rotor to determine a health of the electric machine.

The health monitoring system of any preceding clause, wherein the loading condition for the rotor is at least one of engine operating conditions, flight conditions, rotational speeds of the rotor, or operating environment.

The health monitoring system of any preceding clause, wherein the controller is further configured to compare the maximum rotor temperature correlated to the loading condition to the threshold temperature also correlated to the loading condition.

The health monitoring system of any preceding clause, wherein the health of the electric machine is based upon the comparison of the maximum rotor temperature correlated to the loading condition to the threshold temperature correlated to the loading condition.

A method of determining a health of an electric machine, the method comprising: rotating a rotor; imaging the rotor with a camera during rotation to determine an average rotor temperature; and correlating the average rotor temperature with a loading condition to determine the health of the electric machine.

The method of any preceding clause, further comprising extrapolating the average rotor temperature across at least one other loading condition.

The method of any preceding clause, wherein the camera is coupled to the electric machine.

The method of any preceding clause, wherein the camera is one of an infrared camera or an ultraviolet camera.

The method of any preceding clause, wherein the loading condition is one of an electrical loading, an operating condition, or a rotational speed of the rotor.

The method of any preceding clause, wherein the loading condition is the electrical loading, and wherein the electrical loading is one of power, current, or a demand provided by the electric machine.

The method of any preceding clause, wherein the loading condition is the operating condition for a turbine engine carrying, coupled to, or electrically coupled to the rotor, and wherein the operating condition is one of start-up, idle, taxi, takeoff, climb, cruise, descend, and land.

The method of any preceding clause, wherein the loading condition is the rotational speed of the rotor, and wherein the rotor is part of a generator including the rotor and a stator.

The method of any preceding clause, further comprising storing the average rotor temperature and updating rates or values for extrapolating temperatures across different loading conditions.

The method of any preceding clause, further comprising comparing the average rotor temperature correlated to the loading condition to a threshold.

The method of any preceding clause, further comprising determining the health of the electric machine based upon a comparison of the average rotor temperature correlated to the loading condition to the threshold.

The method of any preceding clause, further comprising outputting at least one of the average rotor temperature correlated to the loading condition or the health of the electric machine to a display.

The method of any preceding clause, further comprising comparing the average rotor temperature correlated with the loading condition to a threshold to determine if the average rotor temperature will exceed the threshold based upon a different loading condition.

The method of any preceding clause, further comprising comparing the average rotor temperature correlated to the loading condition to the threshold also correlated to the loading condition.

The method of any preceding clause, wherein the health of the electric machine is based upon the comparison of the average rotor temperature correlated to the loading condition to the threshold correlated to the loading condition.

The method of any preceding clause, further comprising correlating the threshold with the loading condition.

The method of any preceding clause, further comprising comparing the average rotor temperature correlated with the loading condition to the threshold correlated with the loading condition.

The method of any preceding clause, further comprising extrapolating the average rotor temperature correlated with the loading condition to a different loading condition, and comparing the extrapolated average rotor temperature for the different loading condition to the threshold.

The method of any preceding clause, further comprising extrapolating the threshold correlated with the loading condition to the different loading condition, and comparing the extrapolated average rotor temperature for the different loading condition to the extrapolated threshold correlated with the loading condition.

The method of any preceding clause, further comprising cleaning the camera with an air curtain provided by an air circuit passing through the camera.

What is claimed is:

1. A method of imaging an electric machine, the method comprising:

rotating a rotor spaced from a stator to generate an electric current;

slowing rotation of the rotor during a spin down process;

imaging the rotor at a start of the spin down process to determine a first rotor temperature;

imaging the rotor at an end of the spin down process to determine a second rotor temperature;

determining a rotor temperature reduction as a difference between the first rotor temperature and the second rotor temperature;

imaging the rotor after the end of the spin down process to determine a third rotor temperature; and determining a maximum rotor temperature as a summation of the third rotor temperature and the rotor temperature reduction.

2. The method of claim 1, wherein the electric machine is a generator.

3. The method of claim 1, further comprising comparing the maximum rotor temperature to a threshold temperature.

4. The method of claim 3, further comprising determining a health of the electric machine based upon the comparison of the maximum rotor temperature to the threshold temperature.

5. The method of claim 4, further comprising outputting at least one of the maximum rotor temperature or the health of the electric machine to a display.

6. The method of claim 1, wherein determining the maximum rotor temperature is determined each time the rotor is slowed during the spin down process to determine a trend of the maximum rotor temperature over time.

7. The method of claim 6, further comprising determining when the maximum rotor temperature will exceed a threshold temperature based upon the trend.

8. The method of claim 1, wherein the imaging of the rotor is completed with a camera mounted to the electric machine.

9. The method of claim 8, wherein the camera is an infrared camera.

10. The method of claim 1, wherein imaging the rotor further comprises determining an emissivity of the rotor.

11. The method of claim 1, wherein imaging the rotor further comprising imaging the rotor a plurality of times during the spin down process.

12. The method of claim 11, wherein imaging the rotor the plurality of times further comprises imaging the rotor after the start of the spin down process and before the end of the spin down process.

13. The method of claim 1, further comprising correlating the maximum rotor temperature with a loading condition for the rotor to determine a health of the rotor.

14. The method of claim 13, wherein the loading condition is one of an electrical loading, an operating condition, or a rotational speed of the rotor.

15. The method of claim 14, wherein correlating the maximum rotor temperature with the loading condition further comprises comparing the maximum rotor temperature correlated to the loading condition to a threshold temperature also correlated to the loading condition.

16. The method of claim 15, wherein the health is based upon the comparison of the maximum rotor temperature correlated to the loading condition to the threshold temperature correlated to the loading condition.

17. The method of claim 1, further comprising stopping rotation of the rotor prior to imaging the rotor after the end of the spin down process.

18. The method of claim 1, further comprising outputting the maximum rotor temperature to a display.

19. The method of claim 1, wherein imaging the rotor further comprises imaging the rotor with a camera, and wherein the method further comprises cleaning the camera with an air curtain provided by an air circuit passing through the camera.

20. The method of claim 1, wherein imaging the rotor further comprises imaging the rotor with a camera, and wherein the method further comprises cooling the camera with a supply of air provided by an air circuit passing through the camera.

* * * * *